US012627537B2

(12) United States Patent
Seo et al.

(10) Patent No.: US 12,627,537 B2
(45) Date of Patent: May 12, 2026

(54) MINIMUM EUCLIDEAN DISTANCE FINDER AND OPERATING METHOD THEREOF

(71) Applicant: SAMSUNG ELECTRONICS CO., LTD., Suwon-si (KR)

(72) Inventors: Jungyeong Seo, Suwon-si (KR); Jooyeol Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 111 days.

(21) Appl. No.: 18/613,364

(22) Filed: Mar. 22, 2024

(65) Prior Publication Data

US 2024/0333560 A1     Oct. 3, 2024

(30) Foreign Application Priority Data

Mar. 31, 2023     (KR) ........................ 10-2023-0043090
Jun. 2, 2023     (KR) ........................ 10-2023-0071856

(51) Int. Cl.
    H04L 25/03          (2006.01)
    H03M 13/39          (2006.01)
    H04L 1/00          (2006.01)
(52) U.S. Cl.
    CPC .. H04L 25/03318 (2013.01); H03M 13/3927 (2013.01); H04L 1/0045 (2013.01)
(58) Field of Classification Search
    None
    See application file for complete search history.

(56) References Cited

U.S. PATENT DOCUMENTS 6,529,559 B2 *  3/2003  Reshef ................. H04L 25/067
                                                      375/262
6,993,098 B2 *  1/2006  He .......................... H04L 1/005
                                                      375/262
(Continued)

FOREIGN PATENT DOCUMENTS

CN          101026435 A  *  8/2007
CN          101854329 A  *  10/2010
            (Continued)

OTHER PUBLICATIONS

R. W. Heath and A. J. Paulraj, "Switching between diversity and multiplexing in MIMO systems," in IEEE Transactions on Communications, vol. 53, No. 6, pp. 962-968, Jun. 2005, (Year: 2005).*

(Continued)

*Primary Examiner* — Berhanu Tadese
(74) *Attorney, Agent, or Firm* — Sughrue Mion, PLLC

(57)          ABSTRACT

An operating method of a modem chip includes receiving a first Euclidean distance (ED) set including an ED of first symbol vector candidates, comparing magnitudes of the EDs of the first ED set, calculating each of a first minimum ED corresponding to a bit value of a first bit being 1 and a second minimum ED corresponding to the bit value of the first bit being 0, the first bit being from among a plurality of bits of a plurality of layers of the transmission symbol, based on first index information including results of the comparing the magnitudes of the EDs of the first ED set, updating the first minimum ED and the second minimum ED with a smallest first minimum ED and a smallest second minimum ED, respectively, and detecting the transmission symbol based on the updated first minimum ED and the updated second minimum ED.

20 Claims, 14 Drawing Sheets

(56) References Cited

U.S. PATENT DOCUMENTS

| | | | | |
|---|---|---|---|---|
| 7,321,644 | B2 * | 1/2008 | Love | H04L 1/005 |
| | | | | 375/342 |
| 7,349,496 | B2 * | 3/2008 | Jia | H04L 1/0631 |
| | | | | 375/341 |
| 7,542,743 | B2 | 6/2009 | Lauer et al. | |
| 7,565,594 | B2 * | 7/2009 | Dominique | H03M 13/2957 |
| | | | | 714/755 |
| 7,684,522 | B2 * | 3/2010 | Shashidhar | H04L 25/067 |
| | | | | 375/316 |
| 7,864,896 | B2 * | 1/2011 | Hwang | H04L 25/03184 |
| | | | | 375/347 |
| 8,000,422 | B2 * | 8/2011 | Lee | H04L 27/38 |
| | | | | 375/267 |
| 8,040,980 | B2 * | 10/2011 | Bahng | H04L 25/067 |
| | | | | 375/316 |
| 8,081,577 | B2 * | 12/2011 | Bahng | H04L 25/067 |
| | | | | 370/252 |
| 8,121,220 | B1 * | 2/2012 | Shi | H04L 25/03292 |
| | | | | 375/316 |
| 8,160,182 | B2 | 4/2012 | Chen et al. | |
| 8,279,977 | B2 | 10/2012 | Rayala | |
| 8,300,739 | B2 * | 10/2012 | Chen | H04L 25/03203 |
| | | | | 375/229 |
| 8,320,505 | B2 * | 11/2012 | Yang | H04L 25/03178 |
| | | | | 455/130 |
| 8,385,479 | B2 * | 2/2013 | Lee | H04L 25/03171 |
| | | | | 375/264 |
| 8,396,155 | B2 * | 3/2013 | Leonidovich | H04L 1/0631 |
| | | | | 375/267 |
| 8,432,986 | B2 * | 4/2013 | Lee | H04B 7/0854 |
| | | | | 375/267 |
| 8,442,105 | B1 * | 5/2013 | Dick | H04L 25/067 |
| | | | | 375/348 |
| 8,566,666 | B2 * | 10/2013 | Wang | H03M 13/1148 |
| | | | | 714/752 |
| 8,665,977 | B2 | 3/2014 | Cheng et al. | |
| 8,681,901 | B2 * | 3/2014 | Yang | H04L 27/06 |
| | | | | 375/267 |
| 8,699,605 | B2 * | 4/2014 | Yang | H04B 7/0854 |
| | | | | 375/267 |
| 9,020,076 | B2 * | 4/2015 | Fujii | H04L 25/067 |
| | | | | 375/267 |
| 9,048,975 | B2 * | 6/2015 | Koo | H04L 1/06 |
| 9,083,499 | B1 * | 7/2015 | Tong | H04L 25/03318 |
| 9,160,578 | B2 * | 10/2015 | Paker | H04L 25/03305 |
| 9,246,724 | B2 * | 1/2016 | Xue | H04L 25/067 |
| 9,319,182 | B2 * | 4/2016 | Wan | H04L 25/067 |
| 9,350,457 | B2 * | 5/2016 | Awadalla | H04L 25/067 |
| 9,628,152 | B2 | 4/2017 | Gu et al. | |
| 9,716,601 | B2 * | 7/2017 | Rahmati | H04L 1/0054 |
| 10,181,967 | B2 * | 1/2019 | Rahmati | H04L 25/03305 |
| 10,291,352 | B2 * | 5/2019 | Hong | H04L 1/1896 |
| 10,673,563 | B2 * | 6/2020 | Yan | H03M 13/25 |
| 11,283,545 | B2 * | 3/2022 | Yan | H04L 1/0041 |
| 2002/0154704 | A1 * | 10/2002 | Reshef | H04L 1/0071 |
| | | | | 375/262 |
| 2005/0018789 | A1 * | 1/2005 | Jia | H04L 1/0631 |
| | | | | 375/316 |
| 2005/0271166 | A1 * | 12/2005 | Love | H04L 1/005 |
| | | | | 375/341 |
| 2007/0030925 | A1 * | 2/2007 | Shashidhar | H04L 27/38 |
| | | | | 375/340 |
| 2007/0237272 | A1 * | 10/2007 | Hwang | H04B 7/0854 |
| | | | | 375/267 |
| 2008/0152032 | A1 * | 6/2008 | Lee | H04L 25/03171 |
| | | | | 375/260 |
| 2008/0310556 | A1 * | 12/2008 | Lee | H04L 25/067 |
| | | | | 375/340 |
| 2009/0052593 | A1 * | 2/2009 | Bahng | H04L 25/0246 |
| | | | | 375/341 |
| 2009/0141835 | A1 * | 6/2009 | Yang | H04L 25/03178 |
| | | | | 375/348 |
| 2009/0147890 | A1 * | 6/2009 | Lee | H04B 7/0851 |
| | | | | 375/347 |
| 2010/0142654 | A1 * | 6/2010 | Bang | H04L 25/0321 |
| | | | | 375/340 |
| 2010/0177837 | A1 * | 7/2010 | Leonidovich | H04L 1/0631 |
| | | | | 375/267 |
| 2010/0266071 | A1 * | 10/2010 | Chen | H03M 13/4146 |
| | | | | 375/341 |
| 2011/0051861 | A1 * | 3/2011 | Yang | H04B 7/0854 |
| | | | | 375/341 |
| 2011/0188615 | A1 * | 8/2011 | Yang | H04L 27/06 |
| | | | | 375/341 |
| 2013/0019141 | A1 * | 1/2013 | Wang | H03M 13/1171 |
| | | | | 714/763 |
| 2014/0122979 | A1 * | 5/2014 | Chen | H03M 13/116 |
| | | | | 714/779 |
| 2014/0270014 | A1 * | 9/2014 | Xue | H04L 25/067 |
| | | | | 375/341 |
| 2015/0188641 | A1 * | 7/2015 | Awadalla | H04B 10/65 |
| | | | | 398/202 |
| 2016/0315792 | A1 * | 10/2016 | Rahmati | H04B 7/0413 |
| 2017/0257185 | A1 * | 9/2017 | Hong | H04L 1/1825 |
| 2017/0288912 | A1 * | 10/2017 | Rahmati | H04L 25/0256 |
| 2019/0013824 | A1 * | 1/2019 | Yan | H04L 1/0071 |
| 2019/0081846 | A1 * | 3/2019 | Nishimoto | H03M 13/45 |
| 2020/0295872 | A1 * | 9/2020 | Yan | H03M 7/40 |
| 2020/0395985 | A1 * | 12/2020 | Kwon | H04L 1/0091 |
| 2024/0333560 | A1 * | 10/2024 | Seo | H04L 1/0045 |
| 2025/0247113 | A1 * | 7/2025 | Kim | H04L 1/0051 |

FOREIGN PATENT DOCUMENTS

| | | | | | |
|---|---|---|---|---|---|
| CN | 102237954 | A | * | 11/2011 | |
| CN | 102685045 | A | * | 9/2012 | H04L 25/03 |
| CN | 101854329 | B | * | 11/2012 | |
| CN | 102685046 | B | * | 2/2015 | |
| CN | 102685045 | B | * | 1/2016 | |
| CN | 106254295 | A | * | 12/2016 | H04L 1/007 |
| CN | 111147117 | A | * | 5/2020 | H04B 7/0888 |
| CN | 111262649 | A | * | 6/2020 | H04B 7/0486 |
| CN | 106254295 | B | * | 10/2020 | H04W 52/262 |
| JP | 2002271211 | A | * | 9/2002 | |
| JP | 2008103803 | A | * | 5/2008 | H04L 1/02 |
| JP | 4640993 | B2 | | 3/2011 | |
| JP | WO2017158725 | A1 | * | 1/2019 | H03M 13/45 |
| KR | 20060050438 | A | * | 5/2006 | H04L 27/34 |
| KR | 10-0866805 | B1 | | 11/2008 | |
| KR | 20080109630 | A | * | 12/2008 | H03M 13/3927 |
| KR | 20090097838 | A | * | 9/2009 | H04B 7/0854 |
| KR | 20100057303 | A | * | 5/2010 | H04L 25/0256 |
| KR | 20100065095 | A | * | 6/2010 | H04B 7/0413 |
| KR | 20100083105 | A | * | 7/2010 | H04L 1/0631 |
| KR | 20110089007 | A | * | 8/2011 | H04L 1/06 |
| KR | 10-1402246 | B1 | | 6/2014 | |
| KR | 10-1804809 | B1 | | 12/2017 | |
| RU | 2426255 | C2 | * | 8/2011 | H04L 1/0631 |
| TW | 201644245 | A | * | 12/2016 | H04L 27/18 |
| TW | I668978 | B | * | 8/2019 | H04L 25/0256 |
| TW | 202044783 | A | * | 12/2020 | H04B 7/0842 |
| WO | WO-2006043013 | A1 | * | 4/2006 | H04L 1/0618 |
| WO | WO-2017150943 | A1 | * | 9/2017 | G06F 11/1004 |
| WO | WO-2017158725 | A1 | * | 9/2017 | H04L 25/067 |
| WO | WO-2019039910 | A1 | * | 2/2019 | H04L 1/0045 |

OTHER PUBLICATIONS

Heath et al. Switching Between Diversity and Multiplexing in MIMO Systems, IEEE, vol. 53, No. 6, Jun. 2005 (Year: 2006).*
Communication issued on Aug. 8, 2024 by the European Patent Office for European Patent Application No. 24166920.9.

* cited by examiner

Figure 6B:
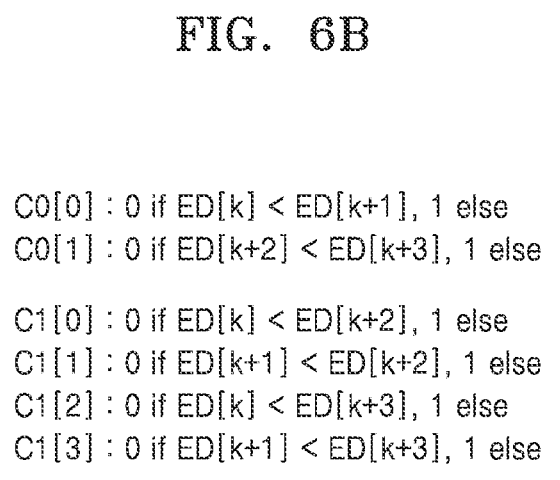

C0[0] : 0 if ED[k] < ED[k+1], 1 else
C0[1] : 0 if ED[k+2] < ED[k+3], 1 else

C1[0] : 0 if ED[k] < ED[k+2], 1 else
C1[1] : 0 if ED[k+1] < ED[k+2], 1 else
C1[2] : 0 if ED[k] < ED[k+3], 1 else
C1[3] : 0 if ED[k+1] < ED[k+3], 1 else

FIG. 7B $\{b_{n,i}(x[k]),b_{n,i}(x[k+1]))\} = \{0,0\} \rightarrow$ s0: 0 if C0[0]=0, 1 if C0[0]=1, s1 = 4

Figure 7B:
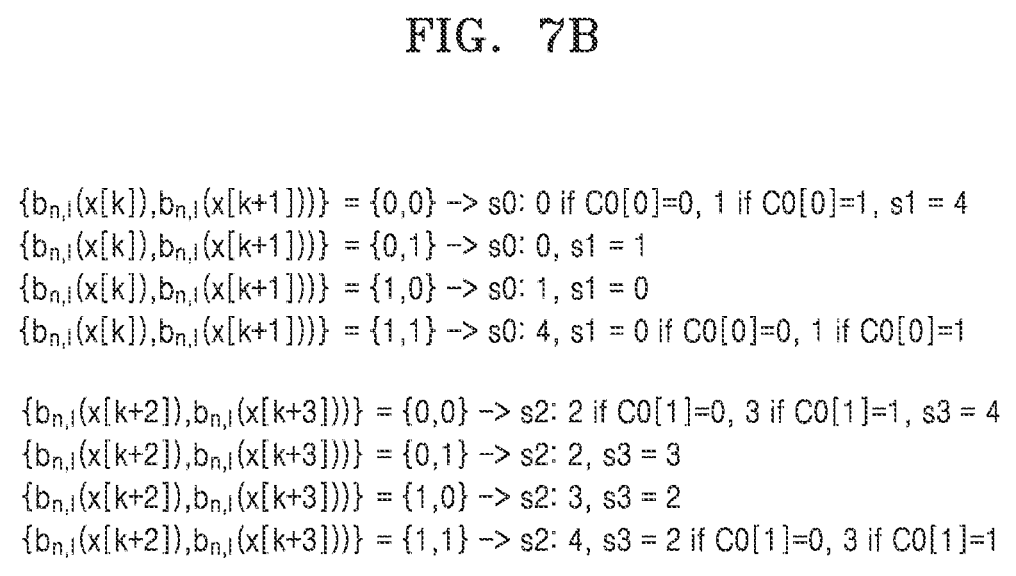

$\{b_{n,i}(x[k]),b_{n,i}(x[k+1]))\} = \{0,1\} \rightarrow$ s0: 0, s1 = 1

$\{b_{n,i}(x[k]),b_{n,i}(x[k+1]))\} = \{1,0\} \rightarrow$ s0: 1, s1 = 0

$\{b_{n,i}(x[k]),b_{n,i}(x[k+1]))\} = \{1,1\} \rightarrow$ s0: 4, s1 = 0 if C0[0]=0, 1 if C0[0]=1

$\{b_{n,i}(x[k+2]),b_{n,i}(x[k+3]))\} = \{0,0\} \rightarrow$ s2: 2 if C0[1]=0, 3 if C0[1]=1, s3 = 4

$\{b_{n,i}(x[k+2]),b_{n,i}(x[k+3]))\} = \{0,1\} \rightarrow$ s2: 2, s3 = 3

$\{b_{n,i}(x[k+2]),b_{n,i}(x[k+3]))\} = \{1,0\} \rightarrow$ s2: 3, s3 = 2

$\{b_{n,i}(x[k+2]),b_{n,i}(x[k+3]))\} = \{1,1\} \rightarrow$ s2: 4, s3 = 2 if C0[1]=0, 3 if C0[1]=1

FIG. 7C

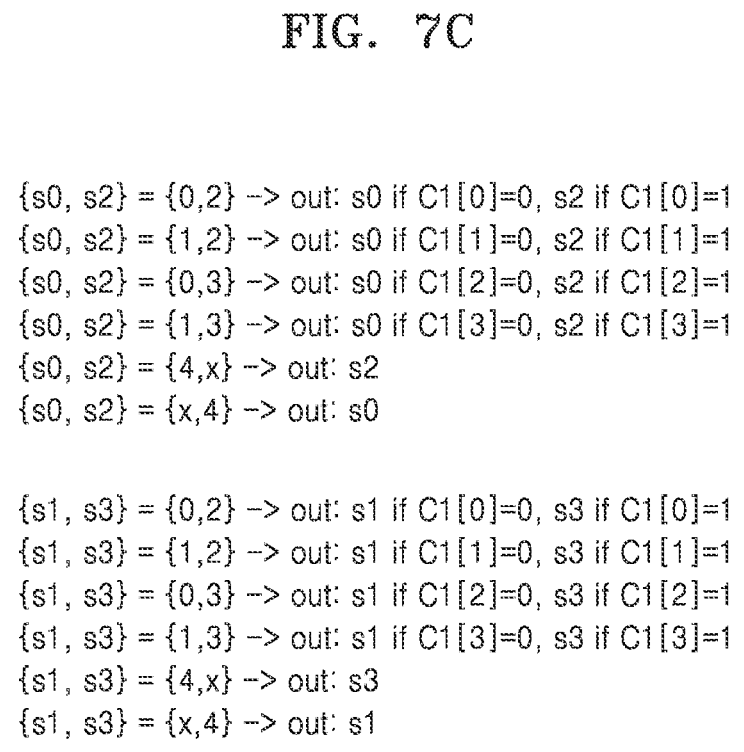

{s0, s2} = {0,2} --> out: s0 if C1[0]=0, s2 if C1[0]=1
{s0, s2} = {1,2} --> out: s0 if C1[1]=0, s2 if C1[1]=1
{s0, s2} = {0,3} --> out: s0 if C1[2]=0, s2 if C1[2]=1
{s0, s2} = {1,3} --> out: s0 if C1[3]=0, s2 if C1[3]=1
{s0, s2} = {4,x} --> out: s2
{s0, s2} = {x,4} --> out: s0

{s1, s3} = {0,2} --> out: s1 if C1[0]=0, s3 if C1[0]=1
{s1, s3} = {1,2} --> out: s1 if C1[1]=0, s3 if C1[1]=1
{s1, s3} = {0,3} --> out: s1 if C1[2]=0, s3 if C1[2]=1
{s1, s3} = {1,3} --> out: s1 if C1[3]=0, s3 if C1[3]=1
{s1, s3} = {4,x} --> out: s3
{s1, s3} = {x,4} --> out: s1

FIG. 9

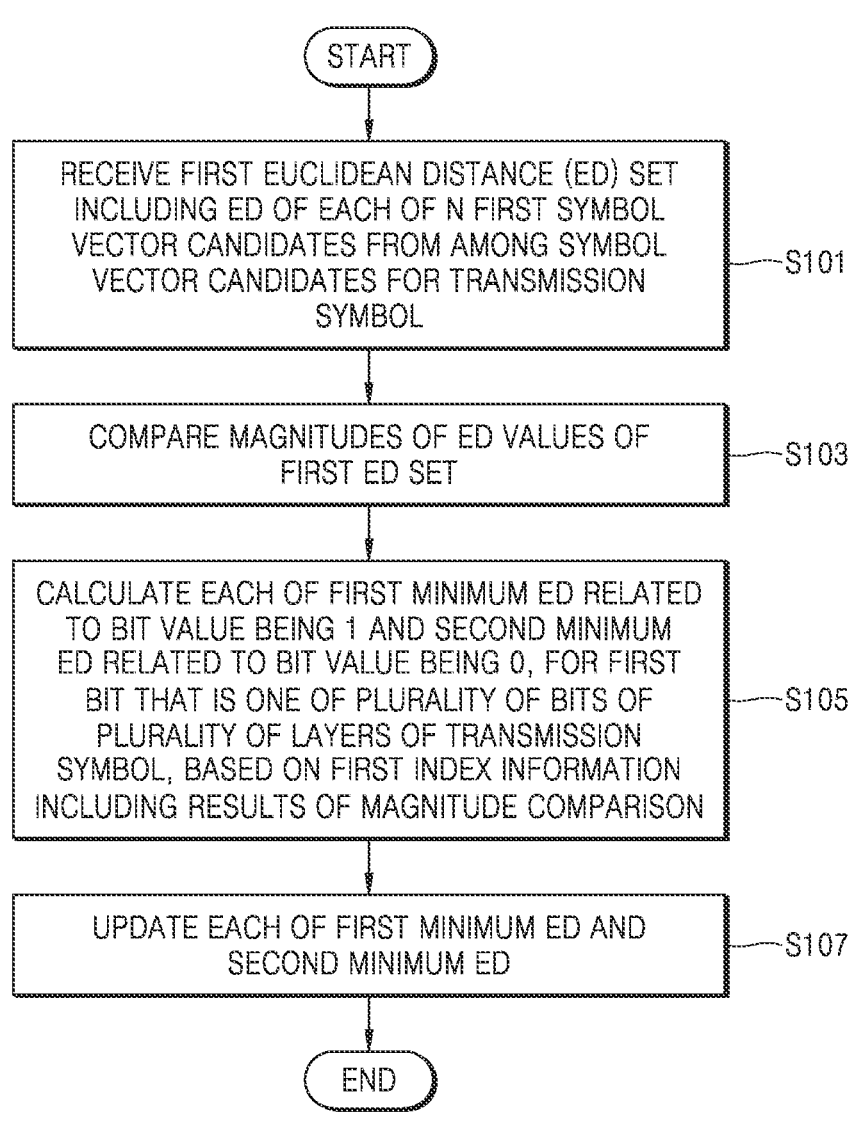

START

RECEIVE FIRST EUCLIDEAN DISTANCE (ED) SET INCLUDING ED OF EACH OF N FIRST SYMBOL VECTOR CANDIDATES FROM AMONG SYMBOL VECTOR CANDIDATES FOR TRANSMISSION SYMBOL ——S101

COMPARE MAGNITUDES OF ED VALUES OF FIRST ED SET ——S103

CALCULATE EACH OF FIRST MINIMUM ED RELATED TO BIT VALUE BEING 1 AND SECOND MINIMUM ED RELATED TO BIT VALUE BEING 0, FOR FIRST BIT THAT IS ONE OF PLURALITY OF BITS OF PLURALITY OF LAYERS OF TRANSMISSION SYMBOL, BASED ON FIRST INDEX INFORMATION INCLUDING RESULTS OF MAGNITUDE COMPARISON ——S105

UPDATE EACH OF FIRST MINIMUM ED AND SECOND MINIMUM ED ——S107

END

MINIMUM EUCLIDEAN DISTANCE FINDER AND OPERATING METHOD THEREOF

CROSS-REFERENCE TO RELATED APPLICATIONS

This application is based on and claims priority under 35 U.S.C. § 119 to Korean Patent Application No. 10-2023-0043090, filed on Mar. 31, 2023, and Korean Patent Application No. 10-2023-0071856, filed on Jun. 2, 2023, in the Korean Intellectual Property Office, the disclosures of each of which being incorporated by reference herein in their entireties.

BACKGROUND

Methods, apparatuses, and devices consistent with the present disclosure relate to a symbol detection method in a wireless communication system and, more particularly, to methods, apparatuses, and devices for obtaining a minimum Euclidean distance (ED) for log-likelihood ratio (LLR) calculation.

A next-generation wireless communication system requires not only various services and high reliability but also a high-speed data transmission speed. Accordingly, studies on a multiple-input multiple-output (MIMO) system are being actively conducted.

The burden of symbol detection may increase as a modulation order and a rank increase. Demands for reducing such burden are increasing.

SUMMARY

It is an aspect to provide a symbol detection method and a hardware structure related thereto. It is an aspect to provide an apparatus for obtaining a minimum Euclidean distance (ED) for log-likelihood ratio (LLR) calculation, and an operating method thereof.

According to an aspect of one or more embodiments, there is provided an operating method of a modem chip, the operating method comprising receiving a first Euclidean distance (ED) set including an ED of each of n first symbol vector candidates from among a plurality of symbol vector candidates for a transmission symbol, wherein n is a natural number of 2 or greater; comparing magnitudes of the EDs of the first ED set; calculating each of a first minimum ED corresponding to a bit value of a first bit being 1 and a second minimum ED corresponding to the bit value of the first bit being 0, the first bit being from among a plurality of bits of a plurality of layers of the transmission symbol, based on first index information including results of the comparing the magnitudes of the EDs of the first ED set; updating the first minimum ED and the second minimum ED with a smallest first minimum ED and a smallest second minimum ED, respectively; and detecting the transmission symbol based on the updated first minimum ED and the updated second minimum ED.

According to another aspect of one or more embodiments, there is provided a modem chip comprising a common comparator configured to receive a first Euclidean distance (ED) set including an ED of each of n first symbol vector candidates from among a plurality of symbol vector candidates for a transmission symbol, wherein n is a natural number of 2 or greater, compare magnitudes of the EDs of the first ED set, and output first index information including results of comparing the magnitudes of the EDs of the first ED set; and an index-based ED finder configured to calculate each of a first minimum ED corresponding to a bit value of a first bit being 1 and a second minimum ED of the bit value of the first bit being 0, the first bit being from among a plurality of bits of a plurality of layers of the transmission symbol, based on the first index information, and update the first minimum ED and the second minimum ED with a smallest first minimum ED and a smallest second minimum ED, respectively.

According to another aspect of one or more embodiments, there is provided a minimum Euclidean distance (ED) finder comprising a common comparator configured to receive a first ED set including an ED of each of four first symbol vector candidates from among a plurality of symbol vector candidates for a transmission symbol, compare magnitudes of the EDs of the first ED set, and output first index information and second index information, the first index information comprising a first magnitude comparison result of a first pair of EDs in the first ED set and a second magnitude comparison result of a second pair of EDs in the first ED set, and the second index information comprising magnitude comparison results of remaining pairs of EDs included in the first ED set; a first classifier configured to receive the first index information and bit values of the first pair of EDs for a first bit that is one of a plurality of bits of a plurality of layers of the transmission symbol, and output a first index related to the bit values of the first bit being 1 and a second index related to the bit values of the first bit being 0; a second classifier configured to receive the first index information and bit values of the second pair of EDs for the first bit, and output a third index related to the bit values of the second pair of EDs for the first bit being 1 and a fourth index related to the bit values of the second pair of EDs for the first bit being 0; a first index-based comparator configured to receive the second index information, the first index, and the third index, and output a fifth index indicating a first minimum ED corresponding to a bit value being 1 for the first bit; a second index-based comparator configured to receive the second index information, the second index, and the fourth index, and output a sixth index indicating a second minimum ED corresponding to the bit value being 0 for the first bit; a converter configured to convert the fifth index into the first minimum ED and the sixth index into the second minimum ED; and an iterative comparison circuit configured to update the first minimum ED and the second minimum ED.

BRIEF DESCRIPTION OF THE DRAWINGS

Various embodiments will be more clearly understood from the following detailed description taken in conjunction with the accompanying drawings, in which:

FIG. 2 is a block diagram of a processor of FIG. 1, according to an embodiment;

FIG. 3 is a block diagram of a minimum Euclidean distance (ED) finder of FIGS. 1 and 2, according to an embodiment;

FIG. 6B illustrates an example of operations of a common comparator, according to an embodiment;

FIG. 7B is a diagram related to operations of a first classifier and a second classifier, according to an embodiment;

FIG. 7C is a diagram related to operations of a first index-based comparator and a second index-based comparator, according to an embodiment;

FIG. 9 is a flowchart of an operating method of an ED finder, according to an embodiment;

DETAILED DESCRIPTION

Figure 1:
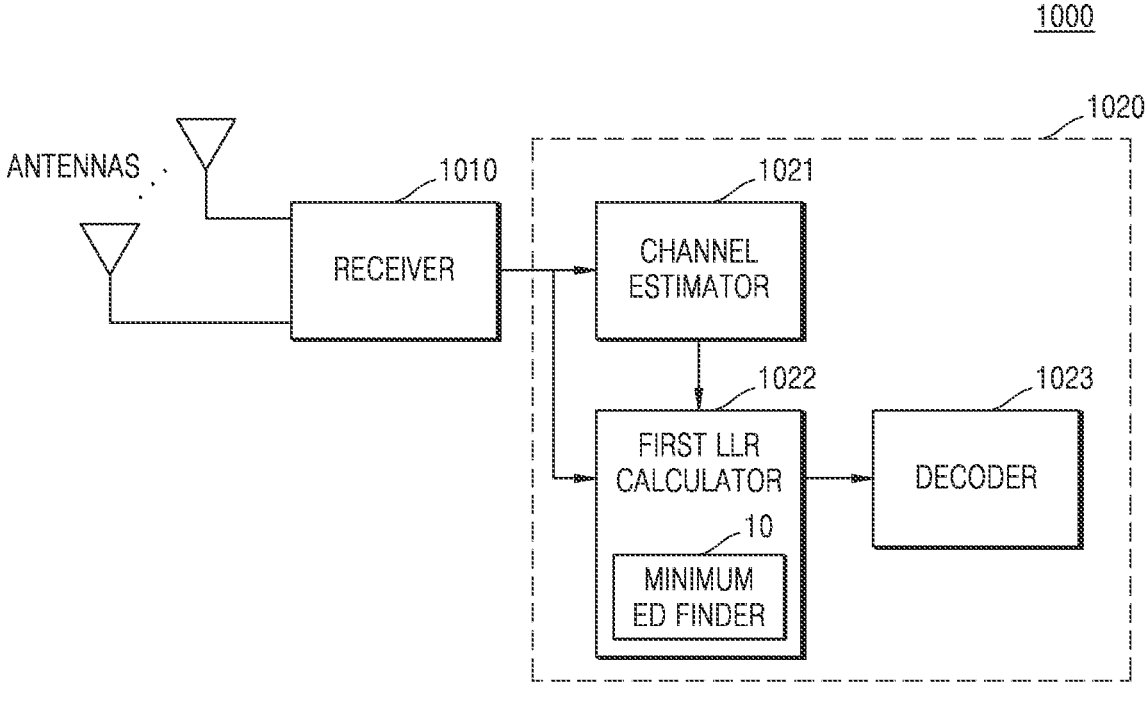
FIG. 1 is a block diagram of a wireless communication apparatus according to an embodiment.

FIG. 1 is a block diagram of a wireless communication apparatus 1000 according to an embodiment.

Referring to FIG. 1, the wireless communication apparatus 1000 according to an embodiment may include a receiver 1010 and a processor 1020. The processor 1020 according to an embodiment may include a channel estimator 1021, a first log-likelihood ratio (LLR) calculator 1022, and a decoder 1023. The first LLR calculator 1022 may include a minimum Euclidean distance (ED) finder 10. In other words, the wireless communication apparatus 1000 may include a modem chip including the minimum ED finder 10. In some embodiments, the processor 1020 may include one or more microprocessors or application processors configured to implement the channel estimator 1021, the LLR calculator 1022, and the decoder 1023.

The wireless communication apparatus 1000 may receive a signal from another wireless communication apparatus through the receiver 1010. The other wireless communication apparatus may be referred to as a transmitting end, and the wireless communication apparatus 1000 may be referred to as a receiving end. The wireless communication apparatus 1000 may transmit the received signal to the first LLR calculator 1022 and the channel estimator 1021 of the processor 1020. The channel estimator 1021 may estimate a channel between the wireless communication apparatus 1000 and the transmitting end, based on a pilot symbol of the received signal. The channel estimator 1021 may transmit the estimated channel to the first LLR calculator 1022. The first LLR calculator 1022 may calculate an LLR for a symbol transmitted by the transmitting end to the wireless communication apparatus 1000, based on the received signal and the estimated channel. In detail, the minimum ED finder 10 of the first LLR calculator 1022 may obtain a first minimum ED and a second minimum ED of bits of the symbol for detecting the symbol transmitted by the transmitting end to the wireless communication apparatus 1000.

According to an embodiment, the first LLR calculator 1022 may select a portion of a plurality of symbol vector candidates for a transmission symbol. In some embodiments, the first LLR calculator 1022 may select a portion of all symbol vector candidates for the transmission symbol. Then, the first LLR calculator 1022 may input, to the minimum ED finder 10, EDs of the selected symbol vector candidates. The minimum ED finder 10 may receive a first ED set including the input EDs. The minimum ED finder 10 may compare magnitudes of ED values of the first ED set.

That is, the minimum ED finder 10 may compare magnitudes of the EDs of the first ED set. The minimum ED finder 10 may calculate each of the first minimum ED for a specific bit having a bit value of 1 and the second minimum ED for the specific bit having a bit value of 0 from among a plurality of bits of a plurality of layers of the transmission symbol, based on index information including results of comparing the magnitudes. The minimum ED finder 10 may update each of the first minimum ED and the second minimum ED for the specific bit.

In other words, the minimum ED finder 10 according to an embodiment may first perform an ED value comparison between candidate symbol vectors and a reception signal, which is commonly used for LLR calculation for each of the plurality of bits of the plurality of layers of the transmission symbol. Accordingly, the minimum ED finder 10 may obtain a minimum ED for each of the plurality of bits, based on comparison result information.

The minimum ED finder 10 according to an embodiment may first perform an overlapping comparison and obtain the minimum ED based on the comparison result information, thereby remarkably reducing the number of comparators included in the minimum ED finder 10. Accordingly, a hardware size of the processor 1020 including the minimum ED finder 10 may be reduced.

The minimum ED finder 10 according to an embodiment may first perform the overlapping comparison and obtain the minimum ED based on the comparison result information, thereby replacing a comparator of a high number of bits included in the minimum ED finder 10 with a multiplexer (MUX) of a low number of bits. Accordingly, a hardware size of the processor 1020 including the minimum ED finder 10 may be reduced.

The minimum ED finder 10 according to an embodiment may first perform the overlapping comparison and obtain the minimum ED based on the comparison result information, thereby reducing overhead for symbol detection in a multiple-input multiple-output (MIMO) system.

The first LLR calculator 1022 may calculate an LLR for bits of the transmission symbol by using the minimum ED. The first LLR calculator 1022 may transmit the LLR to the decoder 1023. The decoder 1023 may decode the symbol received by the wireless communication apparatus 1000 from the other wireless communication apparatus, based on the LLR.

The processor 1020 of the wireless communication apparatus 1000 may use a max-log MAP algorithm as an algorithm for calculating an LLR value. The LLR value using the max-log MAP algorithm may be represented as Equation 1 below.

$$L(b_{n,l}) = \log \frac{\max_{x:b_{n,l}=0} e^{-\frac{\|y-Hx\|^2}{\sigma^2}}}{\max_{x:b_{n,l}=1} e^{-\frac{\|y-Hx\|^2}{\sigma^2}}} = \qquad \text{[Equation 1]}$$

$$\frac{1}{\sigma^2}\left(\min_{x:b_{n,l}=1}\|y-Hx\|^2 - \min_{x:b_{n,l}=0}\|y-Hx\|^2\right)$$

In Equation 1, $b_{n,l}$ denotes an nth bit value of a first layer, $L(b_{n,l})$ denotes an LLR value of an nth bit of the first layer, y denotes a reception signal vector, H denotes a channel matrix, and x denotes a transmission signal candidate.

$$\min_{x:b_{n,i}=1} \|y - Hx\|^2$$

may denote a minimum ED when a bit value is 1.

$$\min_{x:b_{n,i}=0} \|y - Hx\|^2$$

may denote a minimum ED when a bit value is 0. An ED may be a distance between a reception signal and a symbol vector candidate.

To solve Equation 1, $\|y-Hx\|^2$ that is an ED value needs to be calculated for all x. However, considering a complexity of the wireless communication apparatus 1000, an ED value may be obtained for N x. For example, in a situation in which N is four, the wireless communication apparatus 1000 may obtain an ED value N/4 times for four x, thereby calculating ED values for total N x.

An ED when a bit value is 1 and an ED when a bit value is 0 for N x may be represented as Equation 2 below.

$$\min_{x[k]:b_{n,i}=1}\left\{\|y - Hx[k]\|^2\right\}_{k=0}^{N-1} \ \& \ \min_{x[k]:b_{n,i}=0}\left\{\|y - Hx[k]\|^2\right\}_{k=0}^{N-1} \quad \text{[Equation 2]}$$

In Equation 2, $$\min_{x[k]:b_{n,i}=1}\left\{\|y - Hx[k]\|^2\right\}_{k=0}^{N-1}$$

may denote a minimum ED when a bit value is 1 for N x's.

$$\min_{x[k]:b_{n,i}=0}\left\{\|y - Hx[k]\|^2\right\}_{k=0}^{N-1}$$

may denote a minimum ED when a bit value is 0 for N x's.

Figure 2:
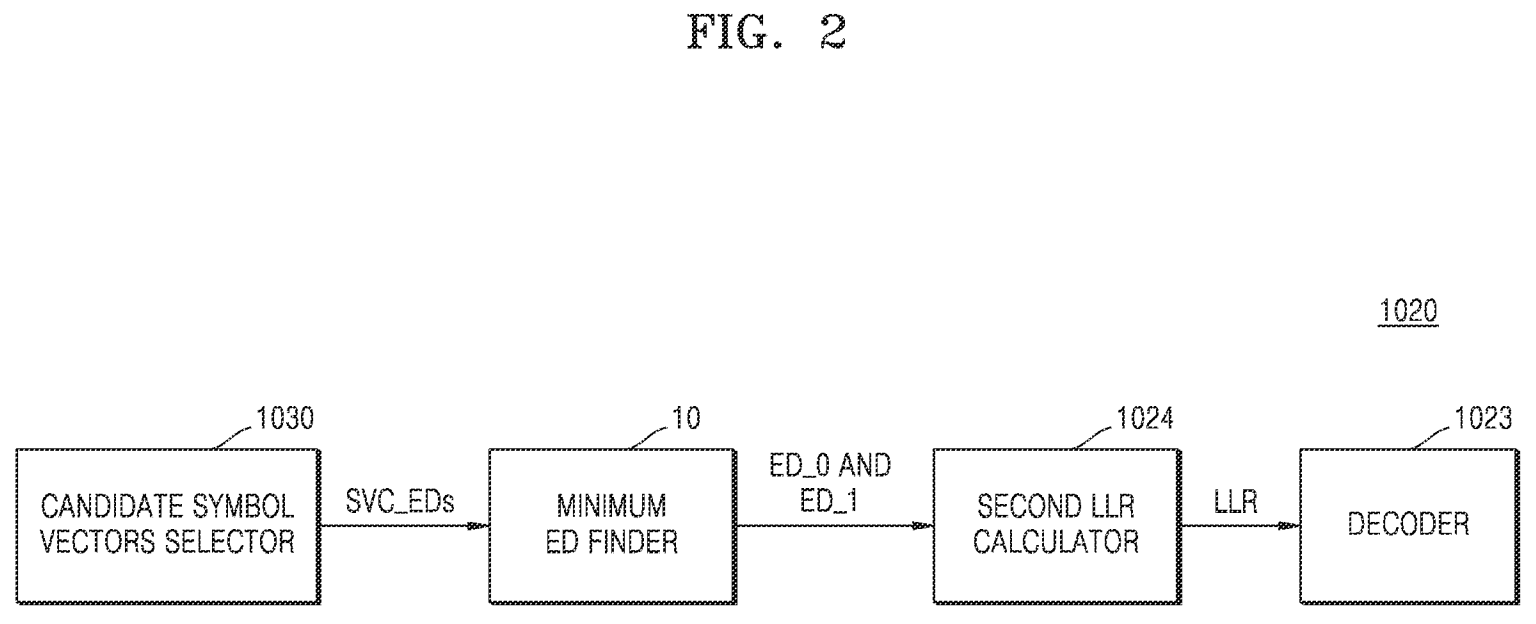

FIG. 2 is a block diagram of the processor 1020 of FIG. 1, according to an embodiment. FIG. 2 may be described with reference to FIG. 1.

Referring to FIG. 2, the processor 1020 according to an embodiment may include a candidate symbol vectors selector 1030, the minimum ED finder 10, a second LLR calculator 1024, and the decoder 1023.

The candidate symbol vectors selector 1030 may select n candidate symbol vectors from among a plurality of symbol vector candidates for the transmission symbol. In some embodiments, the candidate symbol vectors selector 1030 may select the n candidate symbol vectors from among all symbol vector candidates for the transmission symbol. Here, n is a natural number of 2 or greater. The candidate symbol vectors selector 1030 may input EDs SVC_EDs of the selected candidate symbol vectors to the minimum ED finder 10. Accordingly, the minimum ED finder 10 may receive the first ED set including the EDs of the plurality of symbol vector candidates. The minimum ED finder 10 may compare the magnitudes of the EDs (i.e., the magnitudes of the ED values) of the first ED set. The minimum ED finder 10 may calculate each of a first minimum ED ED_1 for a first bit having a bit value of 1 and a second minimum ED ED_0 for the first bit having a bit value of 0 from among the plurality of bits of the plurality of layers of the transmission symbol, based on the index information including the results of comparing the magnitudes. The minimum ED finder 10 may update each of the first minimum ED ED_1 and the second minimum ED ED_0. The minimum ED finder 10 may transmit, to the second LLR calculator 1024, the first minimum ED ED_1 and the second minimum ED ED_0.

The second LLR calculator 1024 may calculate an LLR for the first bit by using the first minimum ED ED_1 and the second minimum ED ED_0. The second LLR calculator 1024 may transmit the LLR to the decoder 1023.

Accordingly, the minimum ED finder 10 according to an embodiment may first perform the overlapping comparison and obtain the minimum ED based on the comparison result information, thereby remarkably reducing the number of comparators included in the minimum ED finder 10. Accordingly, a hardware size of the processor 1020 including the minimum ED finder 10 may be reduced.

Figure 3:
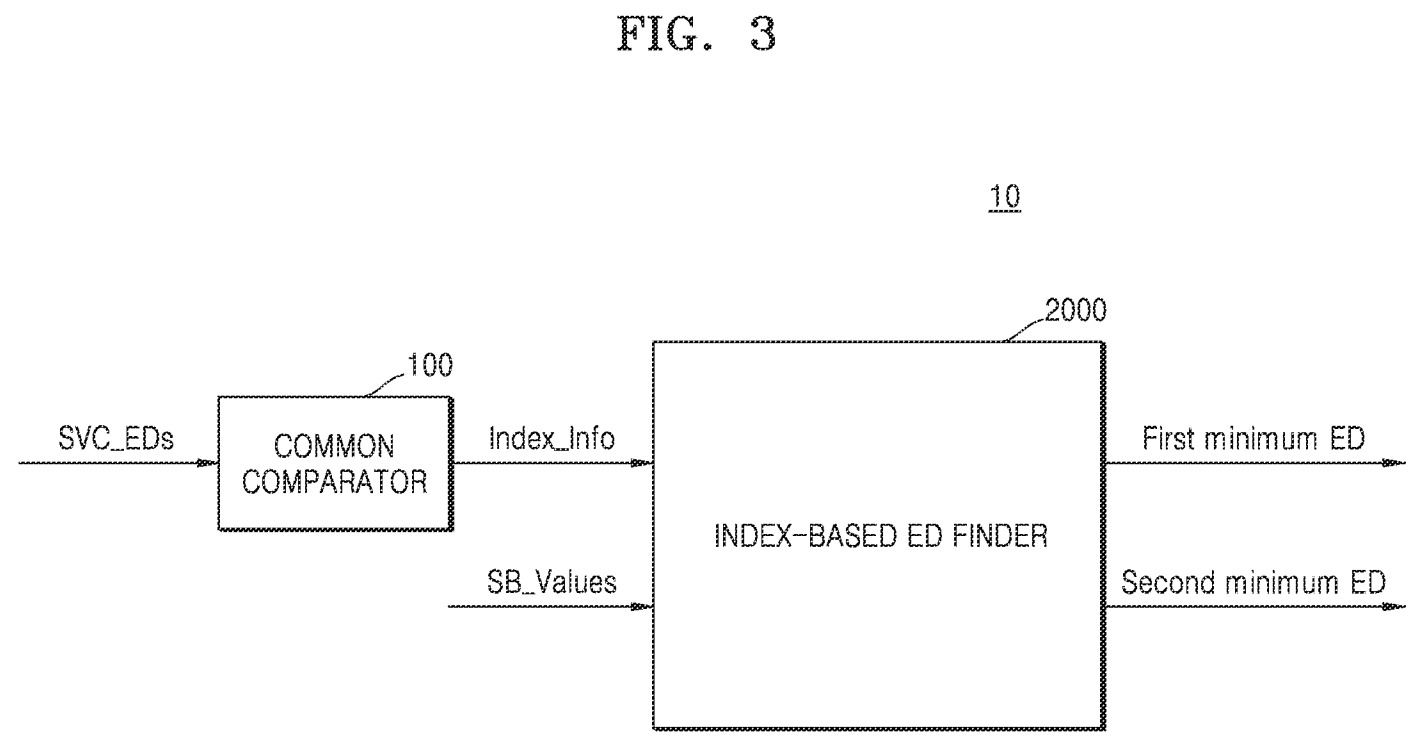

FIG. 3 is a block diagram of the minimum ED finder 10 of FIGS. 1 and 2, according to an embodiment.

Referring to FIG. 3, the minimum ED finder 10 according to an embodiment may include a common comparator 100 and an index-based ED finder 2000.

The common comparator 100 may receive the EDs SVC_EDs between the symbol vector candidates and the reception signal. The common comparator 100 may perform magnitude comparison on the EDs SVC_EDs of the symbol vector candidates. For example, the common comparator 100 may select a pair of EDs (e.g., two EDs) from among the EDs of the candidate symbol vectors and perform magnitude comparison on the pair of EDs (e.g., the two EDs). In other words, the common comparator 100 may perform $_nC_2$ magnitude comparisons on the EDs SVC_EDs of n candidate symbol vectors. Here, n is a natural number of 2 or greater. The common comparator 100 may input, to the index-based ED finder 2000, index information Index_Info including a result of the magnitude comparison.

The index-based ED finder 2000 may receive the index information Index_Info and bit values SB_Values of symbol vector candidates related to a specific bit of the transmission symbol. The index-based ED finder 2000 may output, based on the index information Index_Info and the bit values SB_Values, a first minimum ED and a second minimum ED related to the specific bit. Here, the first minimum ED may be a closest ED between the symbol vector candidate and the reception signal when the specific bit is 1. The second minimum ED may be a closest ED between the symbol vector candidate and the reception signal when the specific bit is 0.

The common comparator 100 may first perform the overlapping comparison and the index-based ED finder 2000 may obtain the minimum ED based on the comparison result information, thereby remarkably reducing the number of comparators included in the minimum ED finder 10. Accordingly, a hardware size of the processor 1020 including the minimum ED finder 10 may be reduced. A comparator of a high number of bits included in the index-based ED finder 2000 may be replaced with a MUX of a low number of bits. Accordingly, a hardware size of the index-based ED finder 2000 may be reduced.

Hereinafter, examples of operations of the common comparator 100 and the index-based ED finder 2000 will be described.

For example, the common comparator 100 may receive the first ED set including the ED of each of n first symbol vector candidates from among the symbol vector candidates for the transmission symbol. The common comparator 100 may compare the magnitudes of the EDs of the first ED set and output first index information including results of the comparison. The index-based ED finder 2000 may calculate each of the first minimum ED for the first bit having the bit value of 1 and the second minimum ED for the first bit having the bit value of 0 from among the plurality of bits of the plurality of layers of the transmission symbol, based on the first index information.

For example, the index-based ED finder 2000 may receive bit values of the first symbol vector candidates related to the first bit. The index-based ED finder 2000 may calculate each of the first minimum ED and the second minimum ED, based on the first index information and the bit values of the first symbol vector candidates related to the first bit.

For example, the index-based ED finder 2000 may divide the first ED set into a second ED set in which the bit values of the first symbol vector candidates are 1 for the first bit and a third ED set in which the bit values of the first symbol vector candidates are 0 for the first bit, based on the first index information. The index-based ED finder 2000 may calculate a smallest first minimum ED in the second ED set, based on the first index information, and calculate a smallest second minimum ED in the third ED set, based on the first index information.

The index-based ED finder 2000 may select a first index indicating a smallest ED from among the EDs of the second ED set, based on the first index information. The index-based ED finder 2000 may convert the first index into a value of the first minimum ED. In some embodiments, the index-based ED finder 2000 may convert the first index into the first minimum ED. The index-based ED finder 2000 may select a second index indicating a smallest ED from among the EDs of the third ED set, based on the first index information. The index-based ED finder 2000 may convert the second index into a value of the second minimum ED. In some embodiments, the index-based ED finder 2000 may convert the second index into the second minimum ED.

The index-based ED finder 2000 may update each of the first minimum ED and the second minimum ED. For example, the common comparator 100 may receive a fourth ED set including an ED of each of n second symbol vector candidates from among the symbol vector candidates, compare magnitudes of the EDs of the fourth ED set, and output second index information including results of the comparison of the magnitudes of the EDs of the fourth ED set. The index-based ED finder 2000 may calculate a third minimum ED for the first bit having a bit value is 1 and a fourth minimum ED for the first bit having a bit value is 0, based on the second index information. The index-based ED finder 2000 may update the first minimum ED to a smaller value from among the first minimum ED and the third minimum ED, and update the second minimum ED to a smaller value from among the second minimum ED and the fourth minimum ED. The first symbol vector candidates may be different from the second symbol vector candidates.

The index-based ED finder 2000 may further include an LLR calculation circuit configured to calculate an LLR for the first bit, based on the first minimum ED and the second minimum ED.

Figure 4:
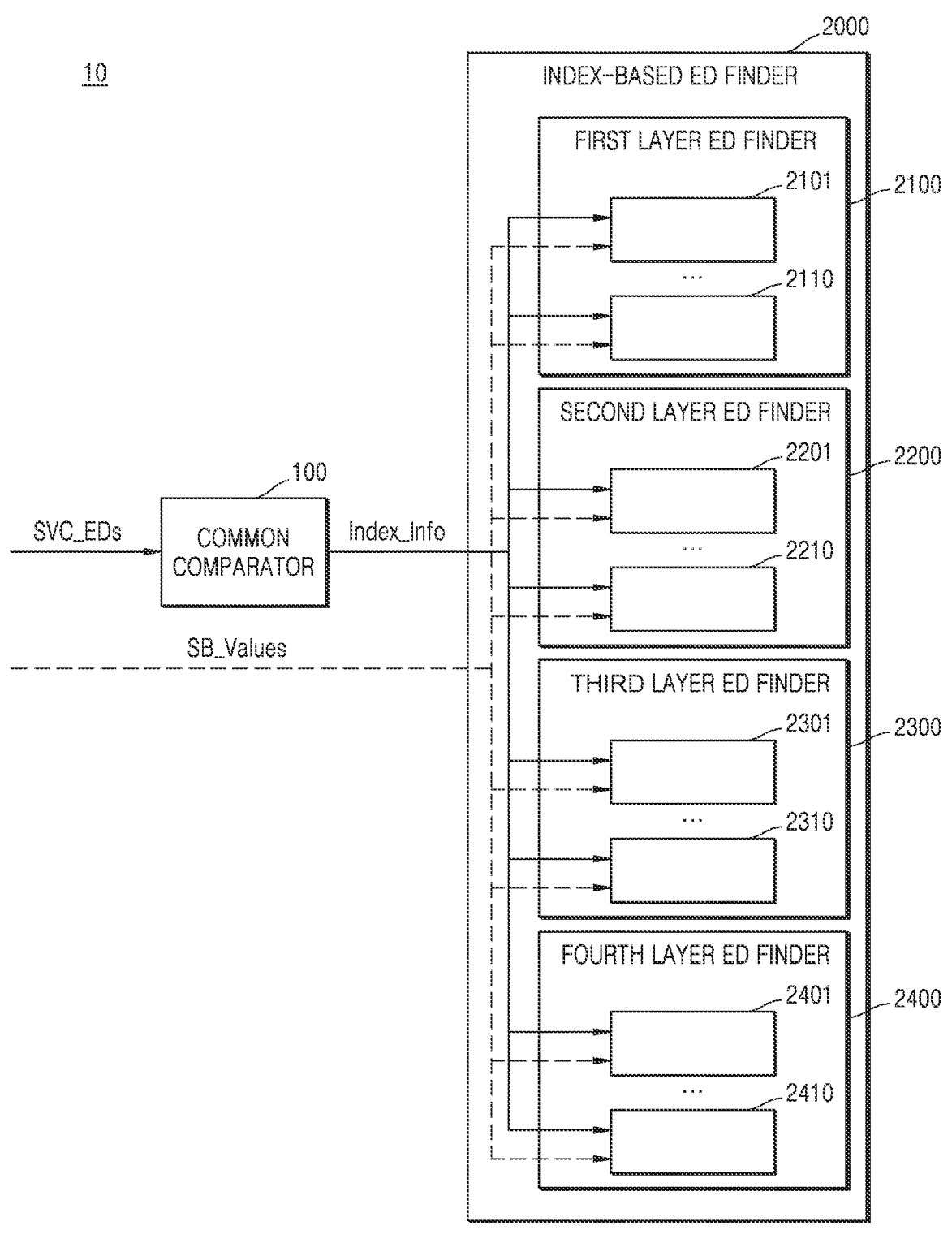
FIG. 4 is a block diagram of the minimum ED finder of FIG. 3, according to an embodiment.

FIG. 4 is a block diagram of the minimum ED finder 10 of FIG. 3, according to an embodiment. FIG. 4 may be described with reference to FIGS. 1 and 3.

Referring to FIG. 4, the minimum ED finder 10 according to an embodiment may include the common comparator 100 and the index-based ED finder 2000. The minimum ED finder 10 of FIG. 4 may detect a symbol based on a rank 4 and 1024 quadrature amplitude modulation (QAM). The minimum ED finder 10 according to some embodiments may detect a symbol based on various ranks and modulation orders according to implementation, and is not limited to the embodiment illustrated in FIG. 4.

The index-based ED finder 2000 may include ED finders for total four layers of a layer 0, a layer 1, a layer 2, and a layer 3, and the ED finder for each layer may include ED finders for 10 bits.

In detail, the index-based ED finder 2000 may include a first layer ED finder 2100, a second layer ED finder 2200, a third layer ED finder 2300, and a fourth layer ED finder 2400. The first layer ED finder 2100 may include first to tenth bit ED finders 2101 to 2110. The first bit finder 2101 may output minimum ED values for $b_{0,0}$. $b_{n,l}$ may denote an nth bit of a 1th layer. Here, n is an integer of 0 to 9, and 1 is an integer of 0 to 3. The tenth bit ED finder 2110 may output minimum ED values for $b_{9,0}$.

The second layer ED finder 2200 may include eleventh to twentieth bit ED finders 2201 to 2210. The third layer ED finder 2300 may include 21st to 30th ED finders 2301 to 2310. The fourth layer ED finder 2400 may include 31st to 40th bit ED finders 2401 to 2410.

The common comparator 100 may receive the EDs SVC_EDs of the symbol vector candidates. The index-based ED finder 2000 may receive the index information Index_Info and the bit values SB_Values of the symbol vector candidates related to the specific bit of the transmission symbol. The index-based ED finder 2000 may output the first minimum ED and the second minimum ED related to the specific bit, based on the index information Index_Info and the bit values SB_Values of the symbol vector candidates related to the specific bit of the transmission symbol. For example, the first bit ED finder 2101 of the first layer ED finder 2100 of the index-based ED finder 2000 may output, for a first bit of a first layer, a minimum ED when a value of the first bit is 1 and a minimum ED when the value of the first bit is 0. For example, the tenth bit ED finder 2110 of the first layer ED finder 2100 may output, for a tenth bit of the first layer, an ED when a value of the tenth bit is 1 and an ED when the value of the tenth bit is 0.

Figure 5:
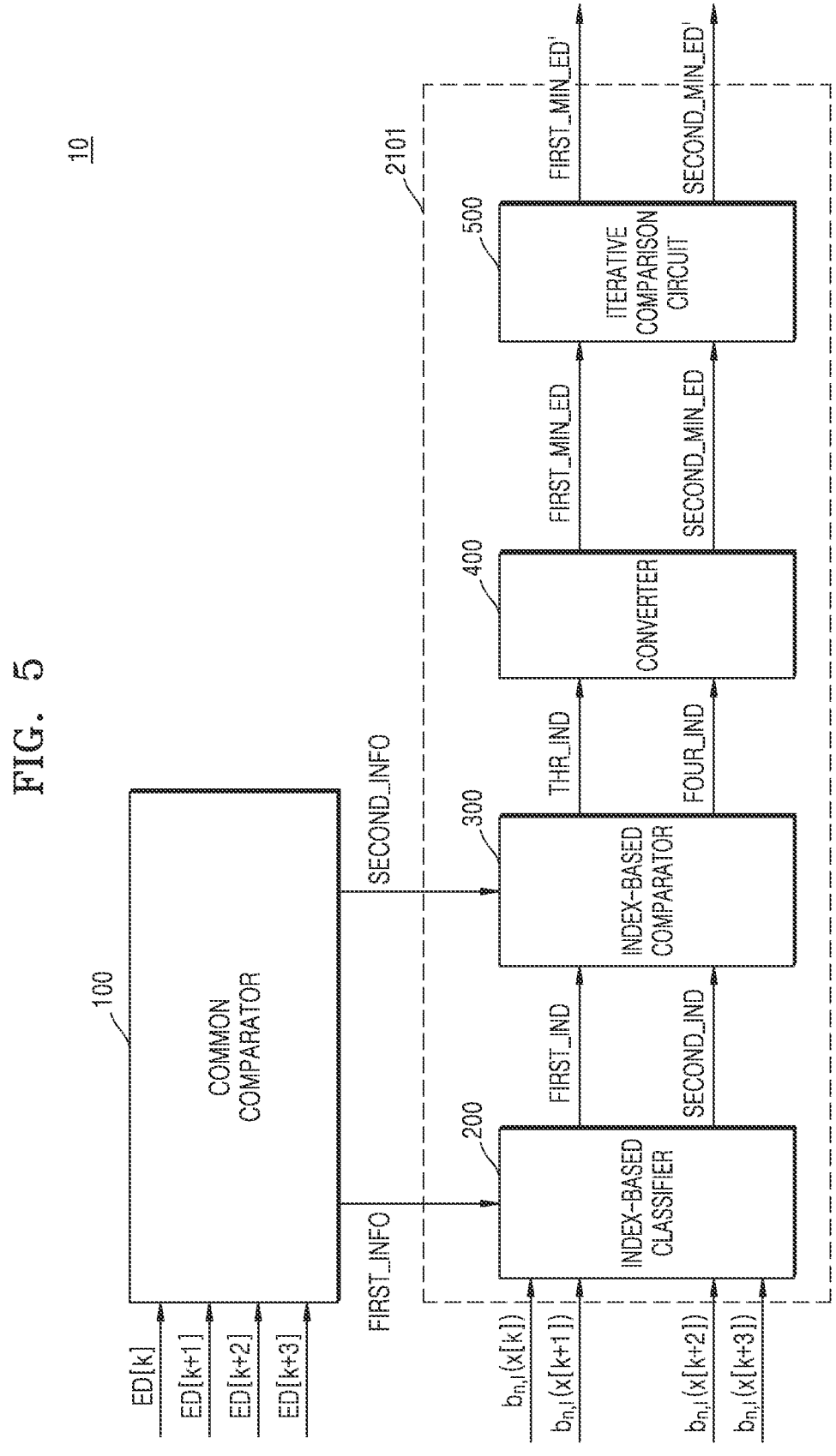
FIG. 5 is a block diagram of the minimum ED finder of FIG. 4, according to an embodiment.

FIG. 5 is a block diagram of the minimum ED finder 10 of FIG. 4, according to an embodiment. FIG. 5 may be described with reference to FIGS. 3 and 4.

Referring to FIG. 5, the minimum ED finder 10 according to an embodiment may include the common comparator 100 and the index-based ED finder 2000. For convenience of description, the first bit ED finder 2101 of the first layer ED finder 2100 from among a plurality of ED finders will be described. However, it will be understood that a similar description applies to the remaining ones of the plurality of ED fingers, e.g., to the second bit ED finder 2102 through the $40^{th}$ bit ED finder 2410 illustrated in FIG. 4).

The first bit ED finder 2101 may include an index-based classifier 200, an index-based comparator 300, a converter 400, and an iterative comparison circuit 500.

The common comparator 100 may receive the first ED set including an ED of each of four first symbol vector candidates from among the symbol vector candidates for the transmission symbol. The first ED set may include ED[k], ED[k+1], ED[k+2], and ED[k+3]. The first ED set may include any number of EDs between a symbol vector candidate and a reception signal, and is not limited an embodiment having four EDs. ED[k] may denote an ED between a kth symbol vector candidate x[k] and the reception signal. ED[k+1] may denote an ED between a (k+1)th symbol vector candidate x[k+1] and the reception signal.

ED[k+2] may denote an ED between a (k+2)th symbol vector candidate x[k+2] and the reception signal. ED[k+3] may denote an ED between a (k+3)th symbol vector candidate x[k+3] and the reception signal. The common comparator 100 may compare magnitudes of ED values of the first ED set. In detail, the common comparator 100 may perform calculations of Equations 3 to 8 below.

$$ED[k] \gtrless ED[k+1] \qquad \text{[Equation 3]}$$

$$ED[k] \gtrless ED[k+2] \qquad \text{[Equation 4]}$$

$$ED[k] \gtrless ED[k+3] \qquad \text{[Equation 5]}$$

$$ED[k+1] \gtrless ED[k+2] \qquad \text{[Equation 6]}$$

$$ED[k+1] \gtrless ED[k+3] \qquad \text{[Equation 7]}$$

$$ED[k+2] \gtrless ED[k+3] \qquad \text{[Equation 8]}$$

In some embodiments, in Equations 3 to 8, $\gtrless$ may denote an operation of selecting a greater value among two values on both sides. According to some embodiments, $\gtrless$ may denote an operation of selecting a smaller value among two values on both sides.

The common comparator 100 may transmit, to the first bit ED finder 2101, the index information Index_Info including a result of comparing the magnitudes. The index information Index_Info may include first index information FIRST_INFO and second index information SECOND_INFO. For example, the common comparator 100 may output the first index information FIRST_INFO and the second index information SECOND_INFO, the first index information FIRST_INFO including a magnitude comparison result of a first pair (e.g., a first two EDs) in the first ED set and a magnitude comparison result of a second pair (e.g., a second two EDs) in the first ED set, and the second index information SECOND_INFO including a magnitude comparison result of remaining pairs of EDs in the first ED set. For example, the first pair may denote ED[k] and ED[k+1] (e.g., equation 3 above), and the second pair may denote ED[k+2] and ED[k+3] (e.g., equation 8 above). For example, the second index information SECOND_INFO may include remaining comparison results (e.g., from equations 4-7 above).

The first bit ED finder 2101 may receive bit values (b_{0,0} (x[k]), b_{0,0} (x[k+1]), b_{0,0} (x[k+2]), and b_{0,0} (x[k+3])) of the first bit for the symbol vector candidates x[k], x[k+1], x[k+2], and x[k+3], the first index information FIRST_INFO, and the second index information SECOND_INFO, and output a first minimum ED FIRST_MIN_ED that is a smallest value from among EDs when a first bit value is 1 and a second minimum ED SECOND_MIN_ED that is a smallest value from among EDs when the first bit value is 0. Here, the first bit is a 0th bit of the layer 0 of the transmission symbol. $b_{n,l}(x[k])$ may denote a bit value of the nth bit of the lth layer for the kth symbol vector candidate x[k]. Here, n is an integer of 0 to 3, and 1 is an integer of 0 to 9. The first minimum ED FIRST_MIN_ED and the second minimum ED SECOND_MIN_ED may be represented as Equations 9 and 10 below.

$$\text{FIRST\_MIN\_EN} = \min_{ED[k]|b_{n,l}(x[k])=1,k=1\ldots N} ED[k] \qquad \text{[Equation 9]}$$

$$\text{SECOND\_MIN\_ED} = \min_{ED[k]|b_{n,l}(x[k])=0,k=1\ldots N} ED[k] \qquad \text{[Equation 10]}$$

In Equations 9 and 10, k and N may be an integer of 2 or greater. $b_{n,l}(x[k])$ may denote the bit value of the nth bit of the lth layer for the kth symbol vector candidate x[k].

The index-based comparator 300 may receive the bit values (b_{0,0} (x[k]), b_{0,0} (x[k+1]), b_{0,0} (x[k+2]), and b_{0,0} (x[k+3])) of the first bit for the symbol vector candidates x[k]. x[k+1], x[k+2], and x[k+3], and the first index information FIRST_INFO. For example, the index-based comparator 300 may receive the bit values (b_{0,0} (x[k]), b_{0,0} (x[k+1])) of the first pair for the first bit, the bit values (b_{0,0} (x[k+2]), b_{0,0} (x[k+3])) of the second pair for the first bit, and the first index information FIRST_INFO. The index-based classifier 200 may output a first index FIRST_IND related to the bit value being 1 and a second index SECOND_IND related to the value of the first bit being 0.

The index-based comparator 300 may receive the second index information SECOND_INFO, the first index FIRST_IND, and the second index SECOND_IND, and output a third index THR_IND for indicating the first minimum ED when the value of the first bit is 1 and a fourth index FOUR_IND for indicating the second minimum ED when the value of the first bit is 0.

The converter 400 may convert the third index THR_IND into the first minimum ED FIRST_MIN_ED and convert the fourth index FOUR_IND into the second minimum ED SECOND_MIN_ED.

The iterative comparison circuit 500 may update the first minimum ED FIRST_MIN_ED and the second minimum ED SECOND_MIN_ED. The iterative comparison circuit 500 may iteratively compare minimum ED values when a bit value is 1 for the symbol vector candidates related to the first bit. The iterative comparison circuit 500 may iteratively compare minimum ED values when a bit value is 0 for the symbol vector candidates related to the first bit.

For example, the iterative comparison circuit 500 may compare the first minimum ED FIRST_MIN_ED with a first minimum ED' FIRST_MIN_ED' that has a smaller value than the first minimum ED FIRST_MIN_ED. The iterative comparison circuit 500 may update the first minimum ED FIRST_MIN_ED to the first minimum ED' FIRST_MIN_ED'. For example, the iterative comparison circuit 500 may store the first minimum ED' FIRST_MIN_ED' that has the smaller value. The iterative comparison circuit 500 may store the first minimum ED' FIRST_MIN_ED' in at least one of a register and a delay.

The iterative comparison circuit 500 may compare the second minimum ED SECOND_MIN_ED with a second minimum ED' SECOND_MIN_ED' that has a smaller value than the second minimum ED SECOND_MIN_ED. The iterative comparison circuit 500 may update the second minimum ED SECOND_MIN_ED to the second minimum ED' SECOND_MIN_ED'. For example, the iterative comparison circuit 500 may store the second minimum ED' SECOND_MIN_ED' that has the smaller value. The iterative comparison circuit 500 may store the second minimum ED' SECOND_MIN_ED' in at least one of the register and the delay.

Figure 6A:
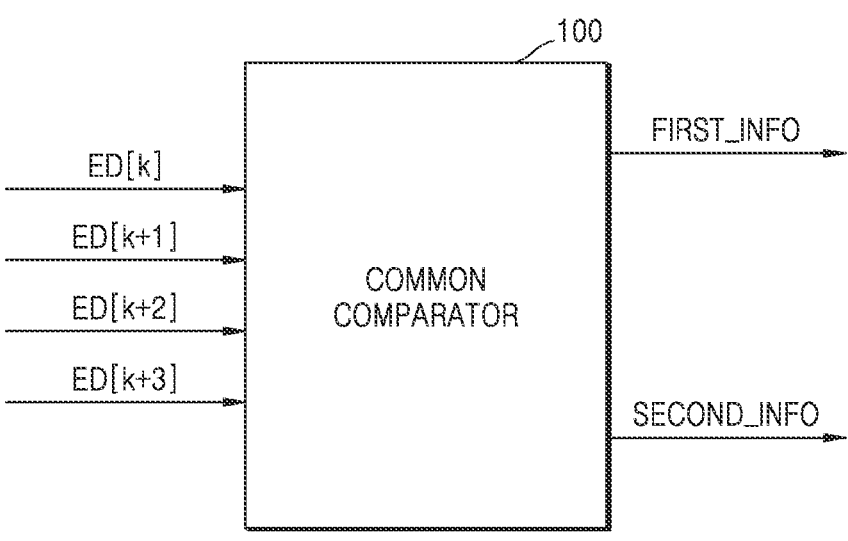
FIG. 6A illustrates a common comparator according to an embodiment.

FIG. 6A illustrates the common comparator 100 according to an embodiment. FIG. 6B illustrates an example of operations of the common comparator 100. FIG. 6A may be described with reference to FIG. 5. Redundant descriptions may be omitted.

Referring to FIG. 6A, the common comparator 100 may receive the first ED set including the ED of each of the four first symbol vector candidates from among the symbol vector candidates for the transmission symbol. An example illustrating four first symbol vector candidates is show in FIG. 6A. However, embodiments are not limited thereto, and in some embodiments, EDs of a different number of first symbol vector candidates may be used. The first ED set may include ED[k], ED[k+1], ED[k+2], and ED[k+3]. The common comparator 100 may compare the magnitudes of the ED values of the first ED set. The common comparator 100 may output the first index information FIRST_INFO and the second index information SECOND_INFO, the first index information FIRST_INFO including the magnitude comparison result of the first pair (e.g., two EDs) in the first ED set and the magnitude comparison result of the second pair (e.g., two EDs) in the first ED set, and the second index information SECOND_INFO including a magnitude comparison result of remaining pairs of EDs in the first ED set. The first pair may be different from the second pair. For example, the first pair may include ED[k] and ED[k+1], and the second pair may include ED[k+2] and ED[k+3].

Referring to FIG. 6B, the first index information FIRST_INFO may include C0[0] and C0[1]. The common comparator 100 may store the first index information FIRST_INFO including C0[0] and C0[1] in a register. The second index information SECOND_INFO may include C1[0], C1[1], C1[2], and C1[3]. The common comparator 100 may store the second index information SECOND_INFO in C1[0], C1[1], C1[2], and C1[3]. C0[0] may be 0 when ED[k] is less than ED[k+1], and may be 1 otherwise. C0[1] may be 0 when ED[k+2] is less than ED[k+3], and may be 1 otherwise. C1[0] may be 0 when ED[k] is less than ED[k+2], and may be 1 otherwise. C1[1] may be 0 when ED[k+1] is less than ED[k+2], and may be 1 otherwise. C1[2] may be 0 when ED[k] is less than ED[k+3], and may be 1 otherwise. C1[3] may be 0 when ED[k+1] is less than ED[k+3], and may be 1 otherwise.

Figure 7A:
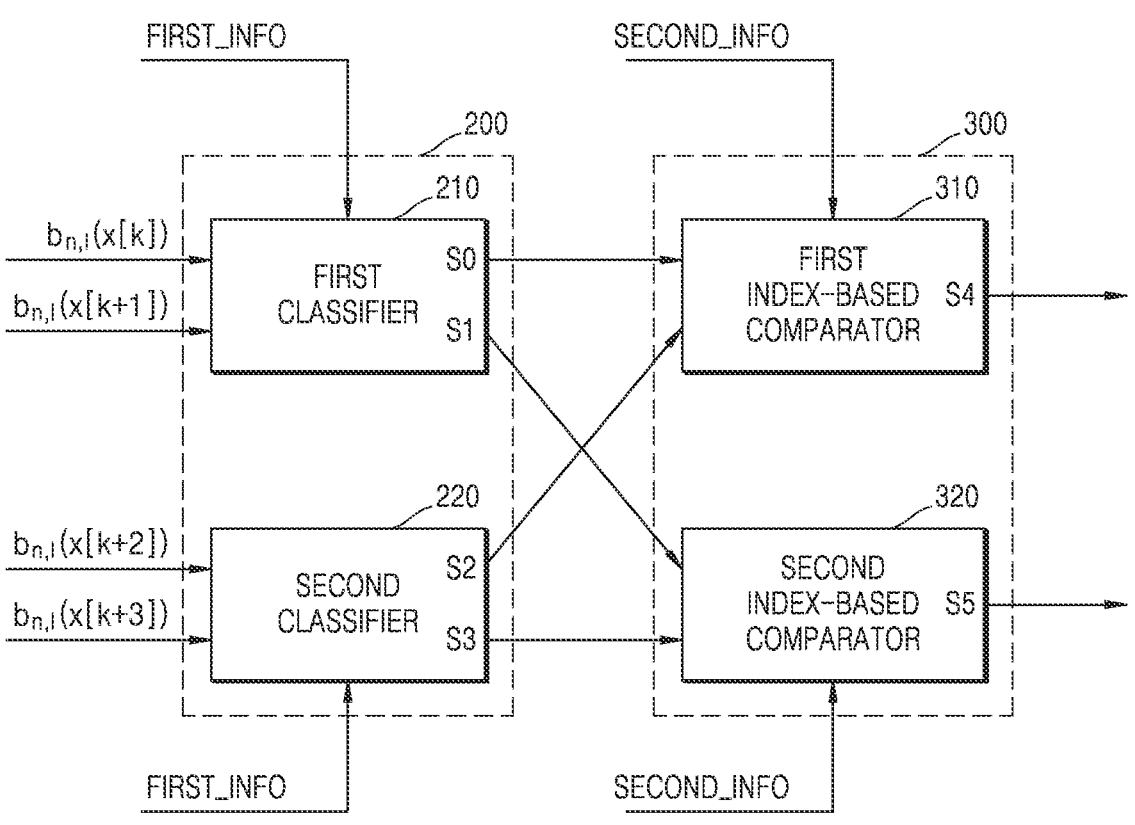
FIG. 7A is a block diagram of an index-based classifier and an index-based comparator, according to an embodiment.

FIG. 7A is a block diagram of the index-based classifier 200 and the index-based comparator 300, according to an embodiment. FIG. 7B is a diagram related to operations of a first classifier 210 and a second classifier 220. FIG. 7C is a diagram related to operations of a first index-based comparator 310 and a second index-based comparator 320. FIG. 7A may be described with reference to FIGS. 5 and 6A.

Referring to FIG. 7A, the index-based classifier 200 may include the first classifier 210 and the second classifier 220. The index-based comparator 300 may include the first index-based comparator 310 and the second index-based comparator 320.

The first classifier 210 may receive the bit values $(b_{n,l}(x[k]), b_{n,l}(x[k+1]))$ of the first pair for the first bit and the first index information FIRST_INFO, and output a first index-based ED S1 related to the value of the first bit being 1 and a second index-based ED S0 related to the value of the first bit being 0. The first bit may be one of the plurality of bits of the plurality of layers of the transmission symbol. $b_{n,l}(x[k])$ may denote an nth bit of a lth layer for the kth symbol vector candidate x[k].

The second classifier 220 may receive the bit values $(b_{n,l}(x[k+2]), b_{n,l}(x[k+3]))$ of the second pair for the first bit and the first index information FIRST_INFO, and output a third index-based ED S3 related to the value of the first bit being 1 and a fourth index-based ED S2 related to the bit value being 0.

The first index-based comparator 310 may receive the second index information SECOND_INFO, the first index-based ED S1, and the third index-based ED S3, and output a fifth index-based ED S4 indicating the first minimum ED related to the bit value being 1 for the first bit.

The second index-based comparator 320 may receive the second index information SECOND_INFO, the second index-based ED S0, and the fourth index-based ED S2, and output a sixth index S5 indicating the second minimum ED related to the bit value being 0 for the first bit.

The converter 400 may convert the fifth index-based ED S4 into the first minimum ED and the sixth index S5 into the second minimum ED (see FIG. 5).

Referring to FIG. 7B, the top four lines of FIG. 7B are related to operations of the first classifier 210 and the bottom four lines of FIG. 7B are related to operations of the second classifier 220.

When the bit values $(b_{n,l}(x[k]), b_{n,l}(x[k+1]))$ corresponding to the first bit input to the first classifier 210 are {0,0}, the second index-based ED S0 is 0 if C0[0]=0, and the second index-based ED S0 is 1 if C0[0]=1. In other words, when the bit values of the symbol vector candidate x[k] corresponding to the first bit and the symbol vector candidate x[k+1] corresponding to the first index are both 0, the second index-based ED S0 indicating a smaller value may be output. When the bit values $(b_{n,l}(x[k]), b_{n,l}(x[k+1]))$ corresponding to the first bit are {0,0}, the first index-based ED S1 is 4.

When the bit values (bn,l(x[k]), bn,l(x[k+1])) corresponding to the first bit $b_{n,l}$ input to the first classifier 210 are {0,1}, the second index-based ED S0 is 0 and the first index-based ED S1 is 1. When the bit values (bn,l(x[k]), bn,l(x[k+1])) corresponding to the first bit $b_{n,l}$ input to the first classifier 210 are {1,0}, the second index-based ED S0 is 1 and the first index-based ED S1 is 0. When the bit values (bn,l(x[k]), bn,l(x[k+1])) corresponding to the first bit $b_{1,1}$ input to the first classifier 210 are {1,1}, the second index-based ED S0 is 4. When the bit values (bn,l(x[k]), bn,l(x[k+1])) corresponding to the first bit $b_{n,l}$ input to the first classifier 210 are {1,1}, the first index-based ED S1 is 0 if C0[0]=0, and the first index-based ED S1 is 1 if C0[0]=1. Like the first classifier 210, the second classifier 220 may output the third index-based ED S3 and the fourth index-based ED S2.

Referring to FIG. 7C, the top four lines in FIG. 7C are related to operations of the first index-based comparator 310 and the bottom four lines in FIG. 7C are related to operations of the second index-based comparator 320.

When the first index-based comparator 310 has received {S0, S2}={0,2}, the second index-based ED S0 may be output if C1[0]=0 and the fourth index-based ED S2 may be output if C1[0]=1. When the first index-based comparator 310 has received {S0, S2}={1,2}, the second index-based ED S0 may be output if C1[1]=0 and the fourth index-based ED S2 may be output if C1[1]=1. When the first index-based comparator 310 has received {S0, S2}={0,3}, the second index-based ED S0 may be output if C1[2]=0 and the fourth index-based ED S2 may be output if C1[2]=1. When the first index-based comparator 310 has received {S0, S2}={1,3}, the second index-based ED S0 may be output if C1[3]=0 and the fourth index-based ED S2 may be output if C1[3]=1. When the first index-based comparator 310 has received {S0, S2}={4,X}, the fourth index-based ED S2 may be output. In other words, when the first index-based comparator 310 has received the second index-based ED S0 having a value of 4, the fourth index-based ED S2 may be output regardless of the fourth index-based ED S2. When the first index-based comparator 310 has received {S0, S2}={X,4}, the second index-based ED S0 may be output. The second index-based comparator 320 may also operate in a similar manner as the first index-based comparator 310.

According to an embodiment, when the bit values of the first pair are both 1, the first index-based ED S1 may indicate a smaller ED from among the two EDs corresponding to the first pair. When the bit values of the first pair are both 0, the second index-based ED S0 may indicate a smaller ED from among the two EDs corresponding to the first pair.

According to an embodiment, when the bit values of the second pair are both 1, the third index-based ED S3 may indicate a smaller ED from among the two EDs corresponding to the second pair. When the bit values of the second pair are both 0, the fourth index-based ED S2 may indicate a smaller ED from among the two EDs corresponding to the second pair.

Figure 8:
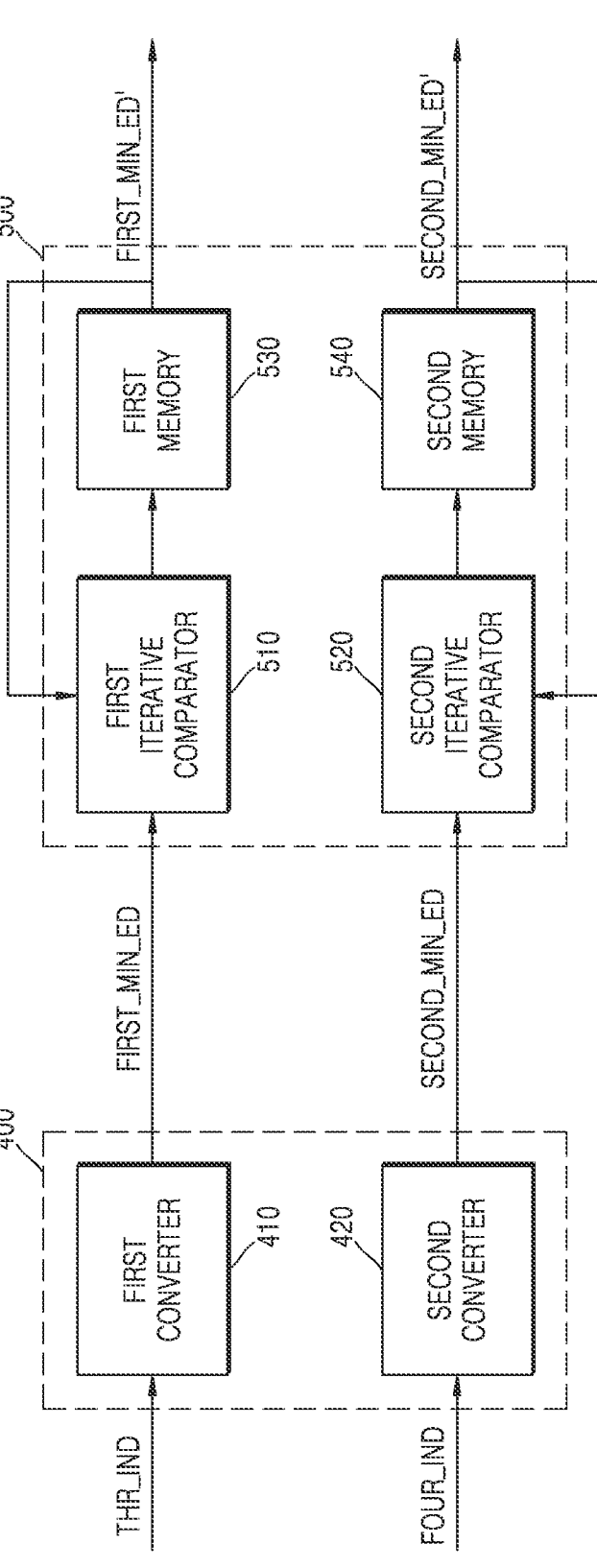
FIG. 8 is a block diagram of a converter and an iterative comparison circuit, according to an embodiment.

FIG. 8 is a block diagram of the converter 400 and the iterative comparison circuit 500, according to an embodiment. FIG. 8 may be described with reference to FIGS. 5-7C.

Referring to FIG. 8, the converter 400 may include a first converter 410 and a second converter 420. The iterative comparison circuit 500 may include a first iterative comparator 510, a second iterative comparator 520, a first memory 530, and a second memory 540.

The first converter 410 may convert the third index THR_IND into the first minimum ED FIRST_MIN_ED. For example, the converter 400 may output a smaller ED value from among comparison targets, based on magnitude comparison information included in the third index THR_IND.

The second converter 420 may convert the fourth index FOUR_IND into the second minimum ED SECOND_MIN_ED. For example, the second converter 420 may output a smaller ED value from among comparison targets, based on magnitude comparison information included in the fourth index FOUR_IND.

The iterative comparison circuit 500 may update each of the first minimum ED FIRST_MIN_ED and the second minimum ED SECOND_MIN_ED. The first iterative comparator 510 may iteratively compare minimum ED values related to a bit value being 1 for the symbol vector candidates. The first iterative comparator 510 may transmit the first minimum ED FIRST_MIN_ED to the first memory 530. The first memory 530 may store the first minimum ED FIRST_MIN_ED and transmit the stored first minimum ED FIRST_MIN_ED back to the first iterative comparator 510. The first iterative comparator 510 may compare the first minimum ED FIRST_MIN_ED obtained based on other symbol vector candidates with the first minimum ED FIRST_MIN_ED obtained from the first memory 530. The first iterative comparator 510 may transmit a smaller value based on a comparison result, back again to the first memory 530. Through such iterative comparison, the first memory 530 may store the smallest first minimum ED' FIRST_MIN_ED' from among the first minimum EDs FIRST_MIN_ED, and output the smallest first minimum ED' FIRST_MIN_ED'. In some cases, the first minimum ED FIRST_MIN_ED may denote the first minimum ED' FIRST_MIN_ED'. In other words, in some cases, the initial first minimum ED FIRST_MIN_ED received from the converter 400 may be the smallest first minimum FIRST_MIN_ED' that is output.

The second iterative comparator 520 may iteratively compare minimum ED values related to a bit value being 0 for the symbol vector candidates. The second iterative comparator 520 may transmit the second minimum ED SECOND_MIN_ED to the second memory 540. The second memory 540 may store the second minimum ED SECOND_MIN_ED and transmit the stored second minimum ED SECOND_MIN_ED back to the second iterative comparator 520. The second iterative comparator 520 may compare the second minimum ED SECOND_MIN_ED obtained based on other symbol vector candidates with the second minimum ED SECOND_MIN_ED obtained from the second memory 540. The second iterative comparator 520 may transmit a smaller value based on a comparison result, back again to the second memory 540. Through such iterative comparison, the second memory 540 may store the smallest second minimum ED' SECOND_MIN_ED' from among the second minimum EDs SECOND_MIN_ED, and output the smallest second minimum ED' SECOND_MIN_ED'. In some cases, the second minimum ED SECOND_MIN_ED may denote the second minimum ED' SECOND_MIN_ED'. In other words, in some cases, the initial second minimum ED SECOND_MIN_ED received from the converter 400 may be the smallest second minimum SECOND_MIN_ED' that is output.

In other words, the iterative comparison circuit 500 may compare the second minimum ED SECOND_MIN_ED with the second minimum ED' SECOND_MIN_ED' that has a smaller value than the second minimum ED SECOND_MIN_ED. The iterative comparison circuit 500 may update the second minimum ED SECOND_MIN_ED to the second minimum ED' SECOND_MIN_ED'. For example, the iterative comparison circuit 500 may store the second minimum ED' SECOND_MIN_ED' that has the smaller value. The iterative comparison circuit 500 may store the second minimum ED' SECOND_MIN_ED' in at least one of the register and the delay.

FIG. 9 is a flowchart of an operating method of an ED finder, according to an embodiment. FIG. 9 may be described with reference to the above-described drawings.

Referring to FIG. 9, in operation S101, the minimum ED finder 10 according to an embodiment may receive the first ED set including the ED of each of the n first symbol vector candidates from among the symbol vector candidates for the transmission symbol.

In operation S103, the minimum ED finder 10 may compare the magnitudes of the ED values of the first ED set.

In operation S105, the minimum ED finder 10 may calculate each of the first minimum ED related to the bit value being 1 and the second minimum ED related to the bit value being 0, for the first bit that is one of the plurality of bits of the plurality of layers of the transmission symbol, based on the first index information FIRST_INFO including results of the magnitude comparison.

For example, the minimum ED finder 10 may receive the bit values of the first symbol vector candidates corresponding to the first bit. The minimum ED finder 10 may calculate each of the first minimum ED and the second minimum ED, based on the first index information FIRST_INFO and the bit values of the first symbol vector candidates related to the first bit.

For example, the minimum ED finder 10 may divide the first ED set into the second ED set related to the bit values of the first symbol vector candidates being 1 and the third ED set related to the bit values of the first symbol vector candidates being 0, for the first bit, based on the first index information FIRST_INFO. The minimum ED finder 10 may calculate the smallest first minimum ED from the second ED set, based on the first index information FIRST_INFO. For example, the minimum ED finder 10 may select the first index indicating the smallest ED from among the EDs of the second ED set, based on the first index information FIRST_INFO. The minimum ED finder 10 may convert the first index into the first minimum ED. The minimum ED finder 10 may calculate the smallest second minimum ED from the third ED set, based on the first index information FIRST_INFO. For example, the minimum ED finder 10 may select the second index indicating the smallest ED from among the EDs of the third ED set, based on the first index information FIRST_INFO. The minimum ED finder 10 may convert the second index into the second minimum ED.

In operation S107, the minimum ED finder 10 may update each of the first minimum ED and the second minimum ED.

For example, the minimum ED finder 10 may receive the fourth ED set including the ED of each of the n second symbol vector candidates from among the symbol vector candidates for the transmission symbol. The minimum ED finder 10 may compare the magnitudes of ED values of the fourth ED set. The minimum ED finder 10 may calculate each of the third minimum ED related to the bit value being 1 and the fourth minimum ED related to the bit value being 0, for the first bit that is one of the plurality of bits of the plurality of layers of the transmission symbol, based on the second index information SECOND_INFO including results of the magnitude comparison of the ED values of the fourth ED set. The minimum ED finder 10 may update the first minimum ED to a smaller value from among the first minimum ED and the third minimum ED. The minimum ED finder 10 may update the second minimum ED to a smaller value from among the second minimum ED and the fourth minimum ED. The minimum ED finder 10 may repeat the above-described operations on the symbol vector candidates. In some embodiments, the minimum ED finder 10 may output the updated first minimum ED and the updated second minimum ED after repeating the above-described operations on a threshold number of symbol vector candidates. The threshold may be pre-determined.

Figure 10:
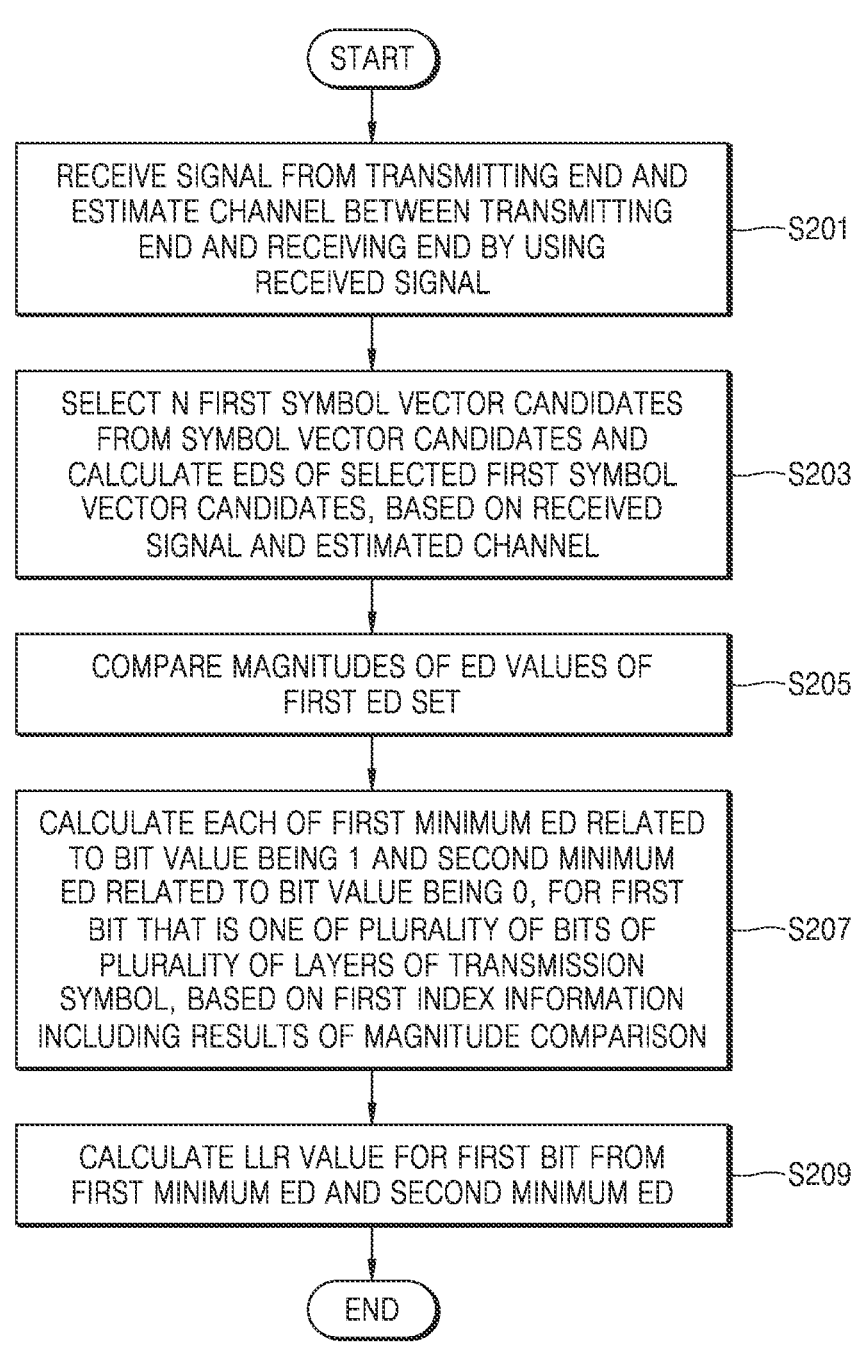
FIG. 10 is a flowchart of an operating method of a wireless communication apparatus, according to an embodiment.

FIG. 10 is a flowchart of an operating method of the wireless communication apparatus 1000, according to an embodiment. FIG. 10 may be described with reference to the above-described drawings.

Referring to FIG. 10, in operation S201, the wireless communication apparatus 1000 according to an embodiment may receive a signal from a transmitting end. The wireless communication apparatus 1000 may estimate a channel between the transmitting end and a receiving end by using a received signal.

In operation S203, the wireless communication apparatus 1000 may select n first symbol vector candidates from symbol vector candidates. The wireless communication apparatus 1000 may calculate EDs of the selected first symbol vector candidates, based on the received signal and the estimated channel. The EDs of the first symbol vector candidates may be referred to as a first ED set.

In operation S205, the wireless communication apparatus 1000 may compare magnitudes of ED values of the first ED set.

In operation S207, the wireless communication apparatus 1000 may calculate each of a first minimum ED related to a bit value being 1 and a second minimum ED related to a bit value being 0, for a first bit that is one of a plurality of bits of a plurality of layers of a transmission symbol, based on first index information FIRST_INFO including results of the magnitude comparison. The wireless communication apparatus 1000 may update each of the first minimum ED and the second minimum ED in a similar manner as the update described above with reference to FIG. 8.

In operation S209, the wireless communication apparatus 1000 may calculate an LLR value for the first bit from the first minimum ED and the second minimum ED. The wireless communication apparatus 1000 may detect the first bit by using the LLR value. The wireless communication apparatus 1000 may detect the transmission symbol by repeating the above-described operations on the plurality of bits of the transmission symbol.

Figure 11:
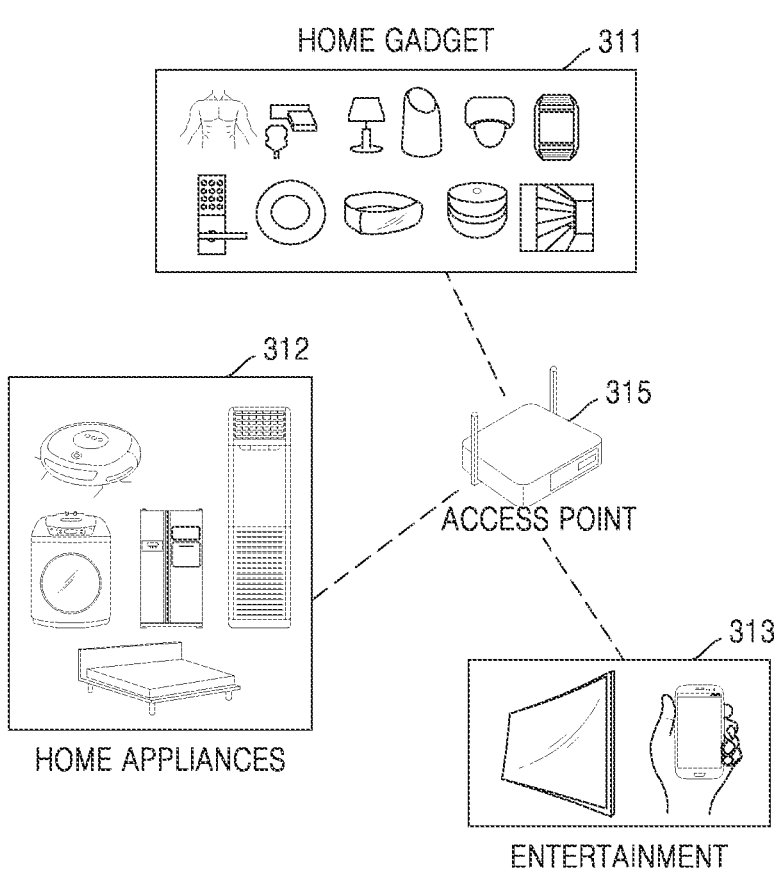
FIG. 11 is a diagram of examples of an apparatus for wireless communication, according to an embodiment.

FIG. 11 is a diagram of examples of an apparatus for wireless communication, according to an embodiment.

FIG. 11 illustrates an Internet of things (IoT) network system including a home gadget 311, a home appliance 312, an entertainment device 313, and an access point 315.

The apparatuses of FIG. 11 for wireless communication may first perform common comparison while calculating an LLR for a plurality of bits of a plurality of layers of a symbol and search for a minimum ED, based on an index including comparison result information, as described above with reference to FIGS. 1 to 10. In some embodiments, each of the apparatuses of FIG. 11 for wireless communication may the first perform common comparison while calculating the LLR for a plurality of bits of a plurality of layers of a symbol and search for a minimum ED, based on an index including comparison result information, as described above with reference to FIGS. 1 to 10.

The apparatuses of FIG. 11 for wireless communication may first perform overlapping comparison and obtain the minimum ED, based on the comparison result information, and thus, the number of comparators included in the apparatuses may be remarkably reduced. In some embodiments, each of the apparatuses of FIG. 11 for wireless communication may first perform overlapping comparison and obtain the minimum ED, based on the comparison result information, and thus, the number of comparators included in each of the apparatuses may be remarkably reduced.

Hereinabove, embodiments have been described in the drawings and specification. In the present specification, although the embodiments have been described by using specific terms, the terms are used only for descriptive purposes and are not intended to limit the meanings or scope of the claims. Therefore, it will be understood by one of ordinary skill in the art that other modifications and equivalents may be made therein. Accordingly, the scope of the present disclosure will be defined by the appended claims.

What is claimed is:

1. An operating method of a modem chip, the operating method comprising:

receiving a first Euclidean distance (ED) set including an ED of each of n first symbol vector candidates from among a plurality of symbol vector candidates for a transmission symbol, wherein n is a natural number of 2 or greater;

comparing magnitudes of each potential combination of two EDs of the first ED set to obtain first index information including results of the comparing the magnitudes of the EDs of the first ED set;

for each bit in the transmission symbol:

calculating each of a first minimum ED corresponding to a bit value of a corresponding bit being 1 and a second minimum ED corresponding to the bit value of the corresponding bit being 0, based on the first index information;

updating the first minimum ED and the second minimum ED with a smallest first minimum ED and a smallest second minimum ED, respectively; and detecting the transmission symbol based on the updated first minimum ED and the updated second minimum ED for each bit in the transmission symbol.

2. The operating method of claim 1, wherein the calculating comprises:

receiving bit values of the n first symbol vector candidates corresponding to the corresponding bit; and calculating the first minimum ED and the second minimum ED, based on the first index information and bit values of the n first symbol vector candidates corresponding to the corresponding bit.

3. The operating method of claim 2, wherein the calculating further comprises:

dividing the first ED set into a second ED set having EDs corresponding to the bit values of the corresponding bit of the n first symbol vector candidates being 1 and a third ED set having EDs corresponding to the bit values of the corresponding bit of the n first symbol vector candidates being 0, based on the first index information;

calculating the smallest first minimum ED from the second ED set based on the first index information; and calculating the smallest second minimum ED from the third ED set based on the first index information.

4. The operating method of claim 3, wherein calculating the first minimum ED comprises:

selecting a first index indicating a smallest ED from among the EDs of the second ED set, based on the first index information; and converting the first index into the first minimum ED.

5. The operating method of claim 3, wherein calculating the second minimum ED comprises:

selecting a second index indicating a smallest ED from among the EDs of the third ED set, based on the first index information; and converting the second index into the second minimum ED.

6. The operating method of claim 1, wherein the updating comprises:

receiving a fourth ED set including an ED of each of n second symbol vector candidates from among the plurality of symbol vector candidates for the transmission symbol;

comparing magnitudes of the EDs of the fourth ED set;

calculating each of a third minimum ED corresponding to the bit value of the corresponding bit being 1 and a fourth minimum ED corresponding to the bit value of the corresponding bit being 0, based on second index information including results of the comparing the magnitudes of the EDs of the fourth ED set; and updating the first minimum ED to a smaller value from among the first minimum ED and the third minimum ED; and updating the second minimum ED to a smaller value from among the second minimum ED and the fourth minimum ED.

7. The operating method of claim 6, wherein the n first symbol vector candidates are different from the n second symbol vector candidates.

8. The operating method of claim 1, further comprising calculating a log likelihood ratio (LLR) for the corresponding bit, based on the first minimum ED and the second minimum ED.

9. A modem chip comprising:

a common comparator configured to receive a first Euclidean distance (ED) set including an ED of each of n first symbol vector candidates from among a plurality of symbol vector candidates for a transmission symbol, wherein n is a natural number of 2 or greater, compare magnitudes of each potential combination of two EDs of the first ED set, and output first index information including results of comparing the magnitudes of the EDs of the first ED set; and an index-based ED finder configured to, for each bit in the transmission symbol:

calculate each of a first minimum ED corresponding to a bit value of a corresponding bit being 1 and a second minimum ED of the bit value of the corresponding bit being 0, based on the first index information, and update the first minimum ED and the second minimum ED with a smallest first minimum ED and a smallest second minimum ED, respectively.

10. The modem chip of claim 9, wherein the index-based ED finder is further configured to receive bit values of the n first symbol vector candidates corresponding to the corresponding bit, and calculate each of the first minimum ED and the second minimum ED, based on the first index information and the bit values of the n first symbol vector candidates corresponding to the corresponding bit.

11. The modem chip of claim 9, wherein the index-based ED finder is further configured to:

divide the first ED set into a second ED set having EDs corresponding to bit values for the corresponding bit of the n first symbol vector candidates being 1 and a third ED set having EDS corresponding to the bit values for the corresponding bit of the n first symbol vector candidates being 0, based on the first index information;

calculate the smallest first minimum ED from the second ED set based on the first index information; and calculate the smallest second minimum ED from the third ED set based on the first index information.

12. The modem chip of claim 11, wherein the index-based ED finder is further configured to:

select a first index indicating a smallest ED from among the EDs of the second ED set, based on the first index information; and convert the first index into the first minimum ED.

13. The modem chip of claim 11, wherein the index-based ED finder is further configured to:

select a second index indicating a smallest ED from among the EDs of the third ED set, based on the first index information; and convert the second index into the second minimum ED.

14. The modem chip of claim 9, wherein the common comparator is further configured to receive a fourth ED set including an ED of each of n second symbol vector candidates from among the plurality of symbol vector candidates for the transmission symbol, compare magnitudes of the EDs of the fourth ED set, and output second index information including results of the comparison of the magnitudes of the EDs of the fourth ED set, and wherein the index-based ED finder is further configured to calculate each of a third minimum ED corresponding to the bit value of the corresponding bit being 1 and a fourth minimum ED corresponding to the bit value of the corresponding bit being 0, based on the second index information, update the first minimum ED to a smaller value from among the first minimum ED and the third minimum ED, and update the second minimum ED to a smaller value from among the second minimum ED and the fourth minimum ED.

15. The modem chip of claim 14, wherein the n first symbol vector candidates are different from the n second symbol vector candidates.

16. The modem chip of claim 9, further comprising a log likelihood ratio (LLR) calculation circuit configured to calculate an LLR for the corresponding first-bit, based on the first minimum ED and the second minimum ED.

17. The modem chip of claim 9, further comprising a symbol detector configured to detect the transmission symbol based on the updated first minimum ED and the updated second minimum ED.

18. A minimum Euclidean distance (ED) finder comprising:

a common comparator configured to receive a first ED set including an ED of each of four first symbol vector candidates from among a plurality of symbol vector candidates for a transmission symbol, compare magnitudes of the EDs of the first ED set, and output first index information and second index information, the first index information comprising a first magnitude comparison result of a first pair of EDs in the first ED set and a second magnitude comparison result of a second pair of EDs in the first ED set, and the second index information comprising magnitude comparison results of remaining pairs of EDs included in the first ED set;

a first classifier configured to receive the first index information and bit values of the first pair of EDs for a first bit that is one of a plurality of bits of a plurality of layers of the transmission symbol, and output a first index related to the bit values of the first bit being 1 and a second index related to the bit values of the first bit being 0;

a second classifier configured to receive the first index information and bit values of the second pair of EDs for the first bit, and output a third index related to the bit values of the second pair of EDs for the first bit being 1 and a fourth index related to the bit values of the second pair of EDs for the first bit being 0;

a first index-based comparator configured to receive the second index information, the first index, and the third index, and output a fifth index indicating a first minimum ED corresponding to a bit value being 1 for the first bit;

a second index-based comparator configured to receive the second index information, the second index, and the fourth index, and output a sixth index indicating a second minimum ED corresponding to the bit value being 0 for the first bit;

a converter configured to convert the fifth index into the first minimum ED and the sixth index into the second minimum ED; and an iterative comparison circuit configured to update the first minimum ED and the second minimum ED.

19. The minimum ED finder of claim 18, wherein the first pair of EDs is different from the second pair of EDs.

20. The minimum ED finder of claim 18, wherein the iterative comparison circuit comprises:

a first comparator configured to compare the first minimum ED to a third minimum ED;

a first register configured to store, as the first minimum ED, a smaller value from among the first minimum ED and the third minimum ED;

a second comparator configured to compare the second minimum ED to a fourth minimum ED; and a second register configured to store, as the second minimum ED, a smaller value from among the second minimum ED and the fourth minimum ED, wherein the third minimum ED and the fourth minimum ED are based on a second ED set including an ED of each of four second symbol vector candidates from among the plurality of symbol vector candidates, and the first ED set is different from the second ED set.

* * * * *